United States Patent
Bandyopadhyay et al.

(10) Patent No.: US 10,340,932 B2
(45) Date of Patent: Jul. 2, 2019

(54) TECHNIQUES FOR POWER EFFICIENT OVERSAMPLING SUCCESSIVE APPROXIMATION REGISTER

(71) Applicant: Analog Devices, Inc., Norwood, MA (US)

(72) Inventors: Abhishek Bandyopadhyay, Winchester, MA (US); Dan Boyko, Norwood, MA (US); Eric G. Nestler, Long Beach Township, NJ (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/583,183

(22) Filed: May 1, 2017

(65) Prior Publication Data

US 2017/0317683 A1    Nov. 2, 2017

Related U.S. Application Data

(60) Provisional application No. 62/330,024, filed on Apr. 29, 2016.

(51) Int. Cl.
```
H03M 1/12      (2006.01)
H03M 1/08      (2006.01)
H03M 1/00      (2006.01)
```
(52) U.S. Cl.
CPC ......... *H03M 1/0854* (2013.01); *H03M 1/002* (2013.01)

(58) Field of Classification Search
CPC .. H03M 1/164; H03M 1/0641; H03M 1/0626; H03M 1/0673; H03M 1/44;
(Continued)

(56) References Cited

U.S. PATENT DOCUMENTS

| | | | | | |
|---|---|---|---|---|---|
| 6,970,120 B1 * | 11/2005 | Bjornsen | ................. | H03M 3/38 |
| | | | | 341/118 |
| 7,224,305 B2 * | 5/2007 | Haartsen | ................. | H03M 1/04 |
| | | | | 341/131 |

(Continued)

OTHER PUBLICATIONS

Harald Garvik et al., *Noise Transfer Functions and Loop Filters Especially Suited for Noise-Shaped Sar ADCs*, 978-1-4799-5341-7/16 © 2016, IEEE, 4 pages.

(Continued)

*Primary Examiner* — Linh V Nguyen
(74) *Attorney, Agent, or Firm* — Patent Capital Group

(57) ABSTRACT

Systems and methods are disclosed for a noise-shaping successive approximation register (SAR) analog-to-digital-converter (ADC) using Sampled Analog Technology (SAT) filter techniques for filter construction. A SAR ADC includes an SAR for receiving an analog input signal and outputting a digital decision, a digital-to-analog converter and logic circuitry for converting the digital decision of the SAR to a present analog residue for a present conversion cycle, a filter for processing a previous analog residue from a previous conversion cycle, and for feeding a processed previous analog residue back to the SAR, a summer for summing the processed previous analog residue from the filter and the present analog residue, and generating a summer output, and a comparator for comparing the summer output and a first reference signal and generating a comparator output. The filter includes a capacitor array for filtering the previous analog residue to generate the processed previous analog residue.

21 Claims, 23 Drawing Sheets

(58) Field of Classification Search
CPC ...... H03M 1/466; H03M 1/0668; H03M 1/12;
H03M 1/201; H03M 1/462; H03M 1/468
USPC ................ 341/188, 120, 143, 150, 155, 172
See application file for complete search history.

(56) References Cited

U.S. PATENT DOCUMENTS

| | | | | |
|---|---|---|---|---|
| 7,439,898 B1* | 10/2008 | Nittala | .................. | H03M 1/462 341/155 |
| 8,378,863 B2* | 2/2013 | Ishikawa | ................. | H03M 1/00 341/118 |
| 8,749,412 B1* | 6/2014 | Tsai | .................... | H03M 1/0697 341/118 |
| 9,197,240 B1* | 11/2015 | Kinyua | ................. | H03M 1/002 |
| 9,425,818 B1* | 8/2016 | Rajaee | .................... | H03M 3/32 |
| 9,444,489 B2* | 9/2016 | Roh | ........................ | H03M 3/39 |
| 2005/0093726 A1* | 5/2005 | Hezar | .................. | H03M 3/412 341/143 |
| 2007/0222656 A1* | 9/2007 | Melanson | ............... | H03M 3/39 341/155 |
| 2008/0186214 A1* | 8/2008 | Janakiraman | ....... | H03M 1/0809 341/110 |
| 2012/0001781 A1* | 1/2012 | Scanlan | ............. | H03M 1/1004 341/110 |
| 2012/0112943 A1* | 5/2012 | Lin | ........................ | H03M 3/30 341/143 |
| 2013/0002459 A1* | 1/2013 | Meacham | ........... | H03M 1/0641 341/110 |
| 2013/0207827 A1* | 8/2013 | Nestler | .................. | H03H 15/02 341/172 |
| 2014/0210653 A1* | 7/2014 | Harpe | ..................... | H03M 1/02 341/110 |
| 2014/0266827 A1 | 9/2014 | Ceballos | | |
| 2015/0022387 A1* | 1/2015 | Chang | ..................... | H03M 3/30 341/143 |
| 2015/0102209 A1* | 4/2015 | Xu | ............................. | G01J 1/44 250/214 LS |
| 2016/0072515 A1* | 3/2016 | Kinyua | ................. | H03M 1/002 341/122 |
| 2016/0182075 A1* | 6/2016 | Devarajan | ........... | H03M 1/1019 341/120 |
| 2016/0352351 A1* | 12/2016 | Miki | ................... | H03M 1/0626 |

OTHER PUBLICATIONS

Yun-Shiang Shu et al., *An Oversampling SAR ADC with DAC Mismatch Error Shaping Arhieving 105dB SFDR and 101dB SNDR over 1kHz BW in 55nm CMOS*, ISSCC 2016, Session 27, Hybrid and Nyquist Data Converters, 27.2, © 2016 IEEE International Solid-State Circuits Conference, 978-14673-9467-3 © 2016 IEEE, 3 pages.

Zhijie Chen et al., A 9.35-ENOB, 14.8fJ/conv.-step Fully-Passive Noise-Shaping SAR ADC, 978-4-86348-502-0 © 2015 Symposium on VLSI Circuits Digest of Technical Papers, 2 pages.

Reza Inanlou et al., A Noise-Shaped SAR ADC for Energy Limited Applications in 90 nm CMOS Technology, Analog Integr Circ Sig Process (2013), DOI: 10.1007/x10470-013-0147-2, 13 pages.

Jeffrey A. Fredenburg et al., A 90-MS/s 11-MHz-Bandwidth 62-dB SNDR Noise-Shaping SAR ADC, 0018-9200 © 2012 IEEE, IEEE Journal of Solid-State Circuits, vol. 47, No. 12, Dec. 2012, 7 pages.

* cited by examiner

TECHNIQUES FOR POWER EFFICIENT OVERSAMPLING SUCCESSIVE APPROXIMATION REGISTER

CROSS-REFERENCE TO RELATED APPLICATION

This Application claims the benefit of priority under 35 U.S.C. § 120 of U.S. Application Ser. No. 62/330,024 filed Apr. 29, 2016, and entitled "Techniques for a Power Efficient Oversampling Successive Approximation Register" naming Abhishek Bandyopadhyay et al. as inventors. The disclosure of the prior Application is considered part of and is incorporated by reference in the disclosure of this Application.

TECHNICAL FIELD OF THE DISCLOSURE

The present invention relates to the field of successive approximation registers and sigma-delta modulation.

BACKGROUND

A successive approximation register (SAR) analog-to-digital converter (ADC) converts analog signals into digital signals using a binary search method. SAR ADCs exhibit high conversion efficiency with moderate resolution and bandwidth, and attempt to reduce ADC noise. Noise-shaping can be used to decrease noise and improve resolution of SAR ADCs. However, attempts at noise-shaping have only been able to achieve first-order noise shaping. Additionally, noise-shaping methods use active operational transconductance amplifiers which consume extra power, and take extra area on the chip.

SUMMARY OF THE DISCLOSURE

Systems and methods for power efficient oversampling successive approximation registers (SARs) are disclosed. In particular, systems and methods are disclosed for filtering the quantization error in a SAR analog-to-digital converter (ADC) on a cycle-by-cycle basis. The quantization error is also referred to as the residue error. Additional extra clock cycles of a DAC in the SAR can be used to yield an accurate analog representation of the quantization error for that conversion cycle. When the SAR conversion is completed for an N-bit ADC, the magnitude of the residue voltage at the top plate of the DAC in the SAR represents the difference between the input and the digital estimate from the N−1th decision. One extra switching of DAC on the final comparator decision gives an analog representation of the quantization error for that conversion cycle.

The quantization error for the conversion cycle is filtered using active or passive filters in the analog domain. In particular, a Sampled Analog Technology (SAT) passive filter technique can be used for filter construction. The filtered error is fed back for the next conversion cycle. The output is decimated to result in the final answer for the cycle.

According to various implementations, the systems and methods discussed herein can also be used on sigma-delta modulation.

According to one aspect, a system for a noise-shaping successive approximation register analog-to-digital-converter comprises a successive approximation register (SAR) for receiving an analog input signal and outputting a digital decision, a digital-to-analog converter (DAC) and logic circuitry for converting the digital decision of the SAR to a present analog residue for a present conversion cycle, a filter for processing a previous analog residue from a previous conversion cycle, and for feeding a processed previous analog residue back to the SAR, a summer for summing the processed previous analog residue from the filter and the present analog residue, and generating a summer output, and a comparator for comparing the summer output and a first reference signal and generating a comparator output. The filter includes a capacitor array having a first plurality of capacitors for filtering the previous analog residue to generate the processed previous analog residue.

In some implementations, the system for a successive approximation register analog-to-digital-converter further includes a first switch for connecting the capacitor array to the DAC during a sample phase.

In some implementations, the filter further comprises an amplifier for amplifying one of the present analog residue and the processed previous analog residue. In some implementations, the filter further comprises an output array having a second plurality of capacitors for receiving the summer output. In various implementations, the summer further sums charges from the second plurality of capacitors in generating a next summer output.

According to some implementations, the filter is one of a finite impulse response filter and an infinite impulse response filter. In some implementations, the filter is a programmable filter and includes a programmable filter order and programmable filter coefficients. In some examples, the filter is programmable to program pass band zeros for different bandwidths. In some examples, the filter has a programmable bandwidth. In some examples, the filter has a programmable spectral shape including a bandpass filter shape.

According to one aspect, a method for noise-shaping in a successive approximation register analog-to-digital converter comprises receiving an input analog signal at a successive approximation register (SAR), converting the input analog signal to a digital signal at the SAR, switching a DAC to convert the digital signal to a present analog residue for a present conversion cycle, processing a previous analog residue from a previous conversion cycle at a filter to generate a processed previous analog residue, outputting the processed previous analog residue to the SAR, summing the processed previous analog residue and the present analog residue and generating a summer output, and comparing the summer output and a first reference signal and generating a comparator output.

In some examples, processing a previous analog residue includes receiving the previous analog residue at a first capacitor array having a first plurality of capacitors, and summing charges from the first plurality of capacitors to generate the processed previous analog residue.

In some implementations, the method includes storing the summer output in a second capacitor array having a second plurality of capacitors, and wherein summing includes summing stored charges from the second plurality of capacitors. In various implementations, the method further comprises amplifying one of the analog present analog residue and the processed previous analog residue.

According to another aspect, a system for a successive approximation register analog-to-digital-converter having a noise transfer function includes a successive approximation register (SAR) for receiving an analog input signal and outputting a digital decision a first digital-to-analog converter (DAC) and logic circuitry for converting the digital decision of the SAR to a present analog residue for a present conversion cycle, and a second DAC for processing a previous analog residue from a previous conversion cycle, and storing a processed previous analog residue at the end of the previous conversion cycle, a filter for receiving the processed previous analog residue from the second DAC and generating a filter output, and a comparator for comparing the filter output and a the present analog residue, and generating a comparator output.

In some implementations, the system includes a third DAC for processing a third analog residue from a conversion cycle before the previous conversion cycle, and storing a third processed analog residue, wherein the filter is further configured to receive the third processed analog residue from the third DAC. An implementation including the third DAC is a second order noise-shaping system. According to various examples, N+1 DACs are used for an Nth order system.

In some implementations, the filter comprises a filter capacitor and an amplifier for amplifying the processed previous analog residue. In various implementations, the filter is configured to a high pass noise transfer function filter. In some implementations, the filter is one of a finite impulse response filter and an infinite impulse response filter. In some implementations, the filter is a programmable filter and includes a programmable filter order and programmable filter coefficients.

In another aspect, a successive approximation register (SAR) analog-to-digital-converter includes a digital-to-analog converter (DAC)) and logic circuitry for converting the digital decision of the SAR to a present analog residue for a present conversion cycle, a filter for processing a previous analog residue from a previous conversion cycle, and for feeding a processed previous analog residue back to the SAR, a summer for summing the processed previous analog residue from the filter and the present analog residue, and generating a summer output, and a comparator for comparing the summer output and a first reference signal and generating a comparator output. The filter includes a capacitor array having a first plurality of capacitors for filtering the previous analog residue to generate the processed previous analog residue.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Systems and methods for power efficient oversampling successive approximation registers (SARs) are disclosed.

In particular, systems and methods are disclosed for filtering the quantization error in a SAR analog-to-digital converter (ADC) on a cycle-by-cycle basis. An SAR ADC includes an internal digital-to-analog converter (DAC), and one or more extra clock cycles of the DAC can be used to yield an accurate analog representation of the quantization error for that conversion cycle. When the SAR conversion is completed for an N-bit ADC, the magnitude of the residue voltage at the top plate of the DAC represents the difference between the input and the digital estimate from the $(N-1)^{th}$ decision.

The quantization error (or residue error) for the conversion cycle is filtered using active or passive filters in the analog domain. In particular, a Sampled Analog Technology (SAT) passive filter technique can be used for filter construction. The filtered error is fed back for the next conversion cycle. The output is decimated to result in the final answer for the cycle.

Sampled Analog Technology signal processing is performed in the analog domain by charge sharing among capacitors using only electronic switches and capacitor elements. A sampled analog filter filters incoming analog signals without first digitizing the signals. Sampled analog technology uses discrete time filter architectures combined with analog signal processing, which eliminates data path quantization noise issues and analog-to-digital and digital-to-analog conversion steps.

According to various implementations, the systems and methods discussed herein can also be used on sigma-delta modulation. Additionally, in some implementations, the DACs discussed herein can be capacitor-based DACs, switched current DACs, or switched resistor DACs. In some implementations, the filters discussed herein can be capacitor-based DACs, switched current DACs, or switched resistor DACs.

Figure 1A:
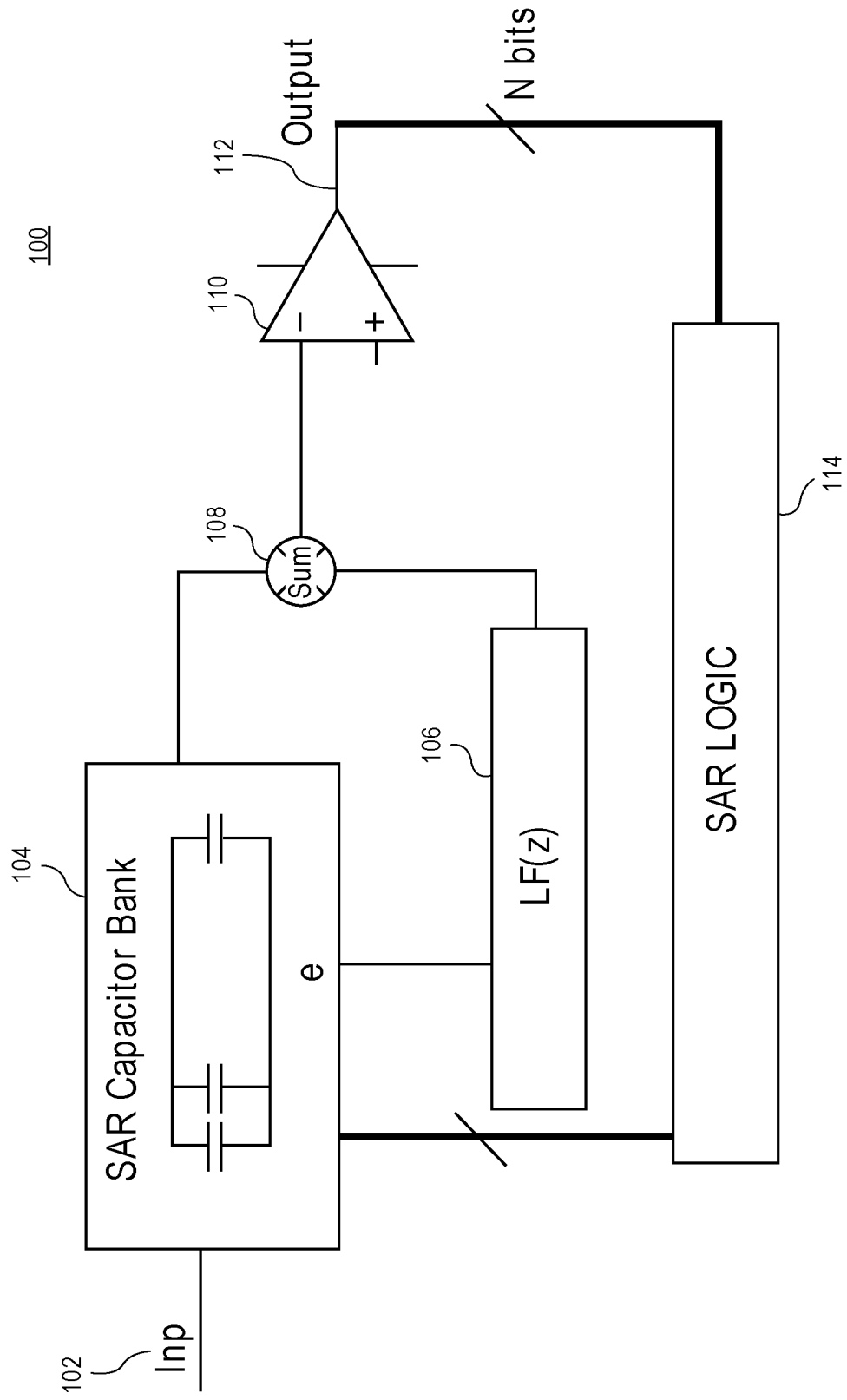
FIGS. 1A-1B is schematics illustrating single ended versions of an SAR, according to some embodiments of the disclosure.

FIG. 1A is a schematic illustrating a single-ended version of an SAR ADC 100, according to some implementations. An ADC with single-ended inputs digitizes the analog input voltage relative to ground. FIG. 1A includes an input 102, an SAR capacitor bank 104, a filter 106, a summer 108, a comparator 110, SAR logic 114, and an output 112. As shown in FIG. 1, an input voltage $V_{in}$ is received at the input 102 to the SAR capacitor bank 104. The SAR capacitor bank 104 is a voltage DAC. In some implementations, the DAC array includes multiple binary-weighted capacitors. In various examples, the DAC array includes one of 128 binary-weighted capacitors, 256 binary-weighted capacitors, and 512 binary-weighted capacitors. The SAR capacitor bank 104 converts the input voltage $V_{in}$ and outputs a signal to a summer 108. The SAR capacitor bank 104 also outputs a signal to the filter 106. The filter 106 outputs a signal to the summer 108. The summer 108 combines the SAR capacitor bank 104 input with the filter 106 input as described in greater detail below, and the output from the summer 108 is input to a comparator 110. The comparator 110 receives the output from the summer 108 and compares it with a reference voltage. As shown in FIG. 1A, the output from the summer 108 is input to the negative terminal of the comparator 110, and the reference voltage is input to the positive terminal of the comparator 110. The output 112 from the comparator 110 is output to SAR logic 114. The output 112 is a digital representation of the state of the inputs. In one example, a low output 112 indicates that the negative terminal of the comparator 110 is higher than the positive terminal of the comparator 110. The SAR logic 114 supplies an approximate digital code of the input voltage $V_{in}$ to the SAR capacitor bank 104. An analog representation of the error is passed from the SAR capacitor bank 104 to the filter 106.

The filter 106 determines a noise transfer function using a Loop Filter (LF) function. In some examples, the LF is a lowpass filter. The LF can be implemented passively using Sampled Analog techniques as described in greater detail below. In other examples, LF can be implemented using active blocks. According to one example:

$$LF(z)=2.93z^{-1}-2.93z^{-2}+z^{-3} \quad (1)$$

Equation (1) can be used for a third order system, to optimize the Noise Transfer Function (NTF) to be of high pass nature and have a zero at DC, and spread the other zeros over the passband.

In some implementations, the filter 106 is a low pass filter. In some implementations, the filter 106 is a programmable filter. In some examples, a programmable filter includes a programmable filter order and programmable filter coefficients. In some examples, the filter is programmable to program pass band zeros for different bandwidths. In some examples, the filter has a programmable bandwidth.

Figure 1B:
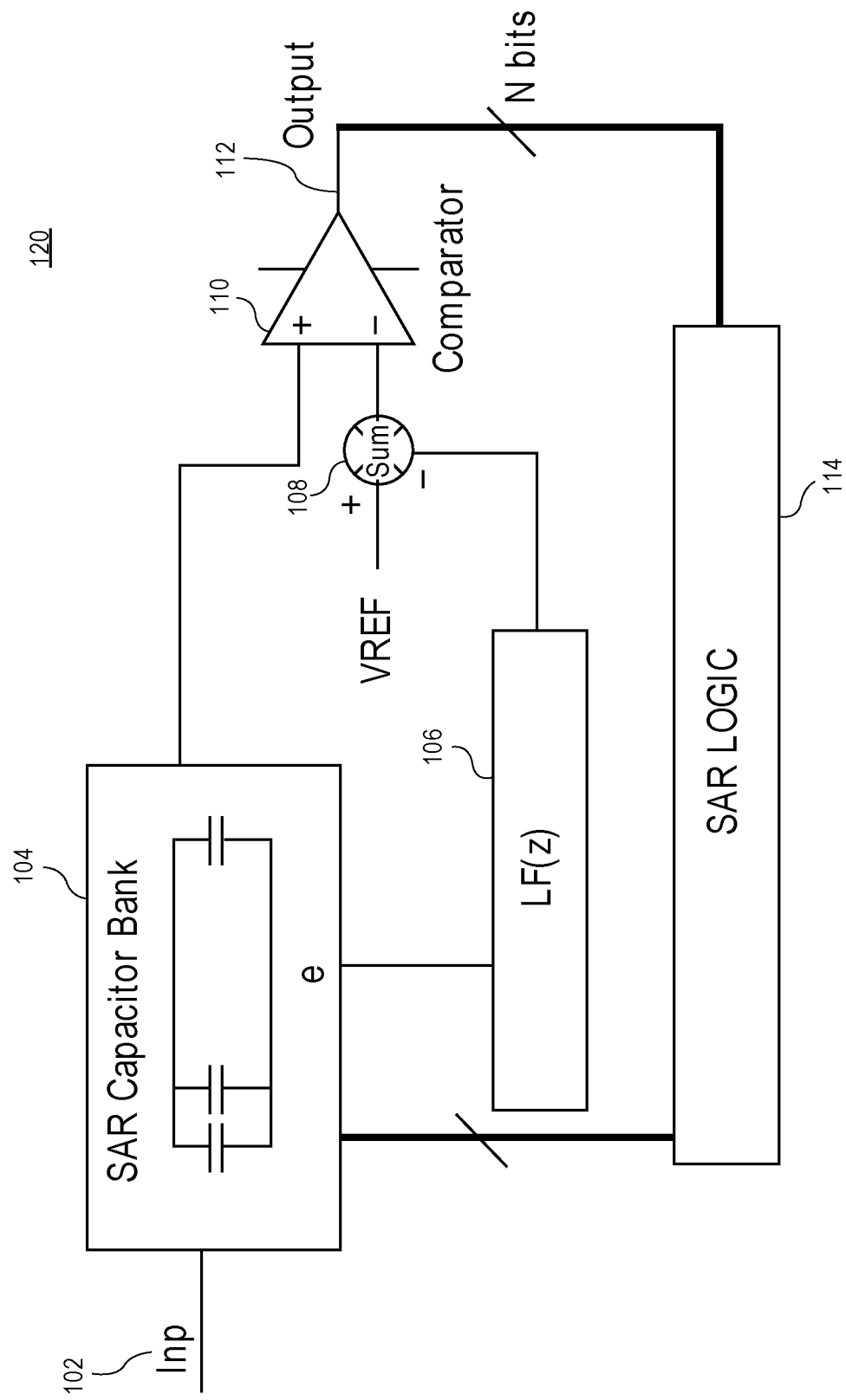

FIG. 1B is a schematic illustrating a single-ended version of an SAR ADC 120, according to some implementations. Similar to FIG. 1A, FIG. 1B includes an input 102, an SAR capacitor bank 104, a filter 106, a summer 108, a comparator 110, SAR logic 114, and an output 112. In the SAR ADC 120, the output from the SAR capacitor bank 104 is input directly to the positive terminal of the comparator 110. The output from the filter 106 is input to the summer 108, where it is polarity swapped, and summed with the reference voltage. The output from the summer 108 is input to the negative terminal of the comparator 110.

The SAR ADC shown in FIGS. 1A, 1B can be used to sample and filter the quantization error on a cycle by cycle basis. The quantization error for a given conversion cycle is low pass filtered and fed back for the next conversion cycle, for second or third order shaping of the noise.

FIGS. 1A, 1B show a single-ended version of an SAR ADC, which digitizes the analog input voltage relative to ground. Single-ended inputs can either be unipolar or bipolar. The analog input on a single-ended unipolar ADC swings only above ground, and the analog input on a single-ended bipolar ADC (or true bipolar), swings above or below ground. In other implementations, an SAR ADC as described herein has pseudo-differential inputs, and digitize the differential analog input voltage over a limited range. According to various implementations, the SAR ADC can have unipolar pseudo-differential inputs, bipolar pseudo-differential inputs, or true bipolar pseudo-differential inputs. In some implementations, the SAR ADC has fully-differential inputs, and in some implementations, the SAR ADC has fully differential true bipolar inputs. In various implementations, the SAR ADC is a fully differential circuit.

In various implementations, an SAR ADC can be clocked synchronously or asynchronously. Similarly, in various implementations, the filters can be clocked synchronously or asynchronously. In some examples, the residue can be estimated using one or more clock cycles. In some implementations, the order K of the overall ADC, can be any order (for example, $1^{st}$, $2^{nd}$, $3^{rd}$, $4^{th}$, 5th, or greater than $5^{th}$). An example of a $3^{rd}$ order system is shown in FIG. 2.

According to some implementations, SAR ADCs exhibit high conversion efficiency with moderate resolution and bandwidth. Additionally, SAR ADCs are digital process friendly. SAR ADCs can be designed to use very low supply voltages. For moderate to high resolution SARs the comparator is the dominant source of noise and power. In some implementations, for high resolution SARs, the preamplifier dominates the power budget.

Figure 2:
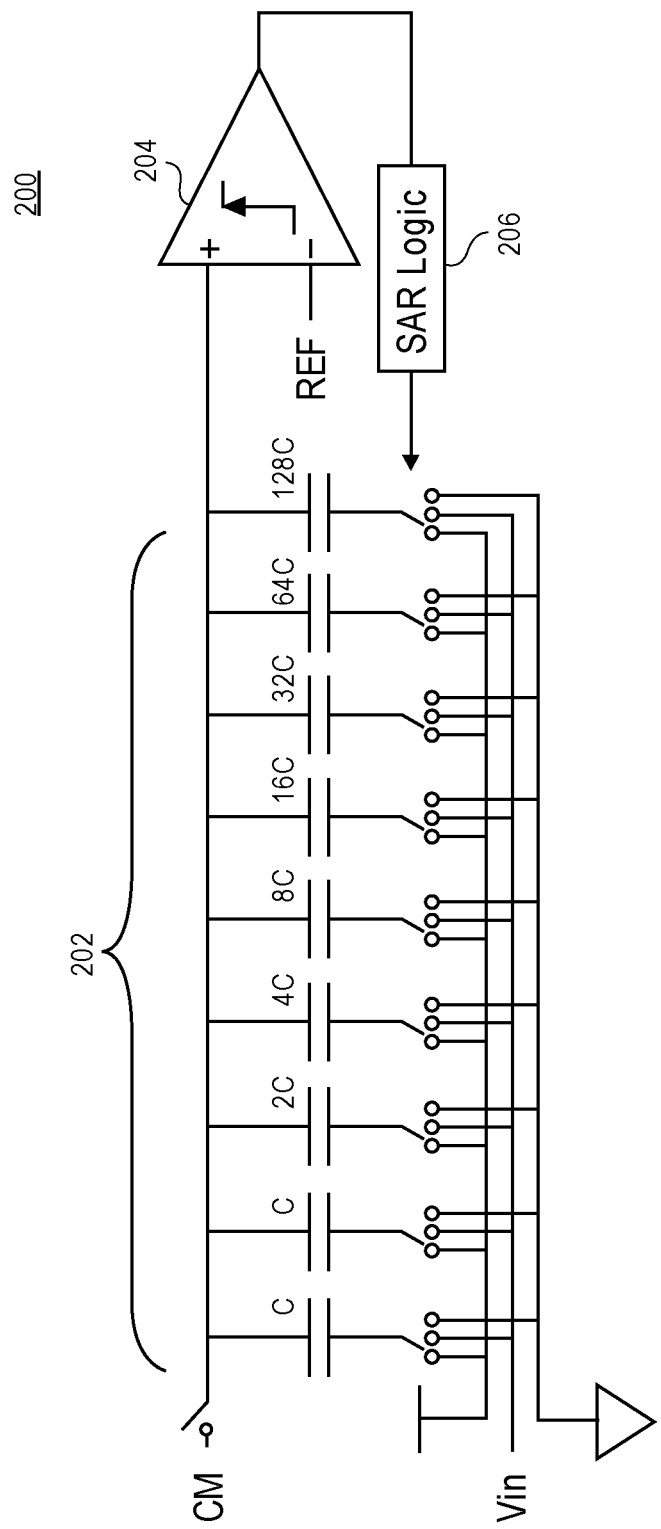
FIG. 2 is a diagram illustrating a simplified basic SAR, according to some embodiments of the disclosure.

FIG. 2 is a diagram illustrating a simplified basic SAR 200, according to some implementations. The SAR 200 includes a capacitor array 202, a comparator 204, and SAR logic 206. The bottom plate of the capacitor array 202 can receive one of three inputs: $V_{in}$, $V_{ref}$ and ground. The bottom plate of the capacitor array 202 samples the input signal, and the comparator 204 receives an input from the top plate of the capacitor array 202 and compares it to a reference voltage, REF which is usually provided either externally or from a reference generator or buffer. SAR logic 206 implements a binary search. The difference between the final digital output and the analog input is referred to as the residue, and the residue is thrown away after the logic is finished. In some examples, the capacitor array 202 shown in FIG. 2 is a DAC Array.

Figure 3:
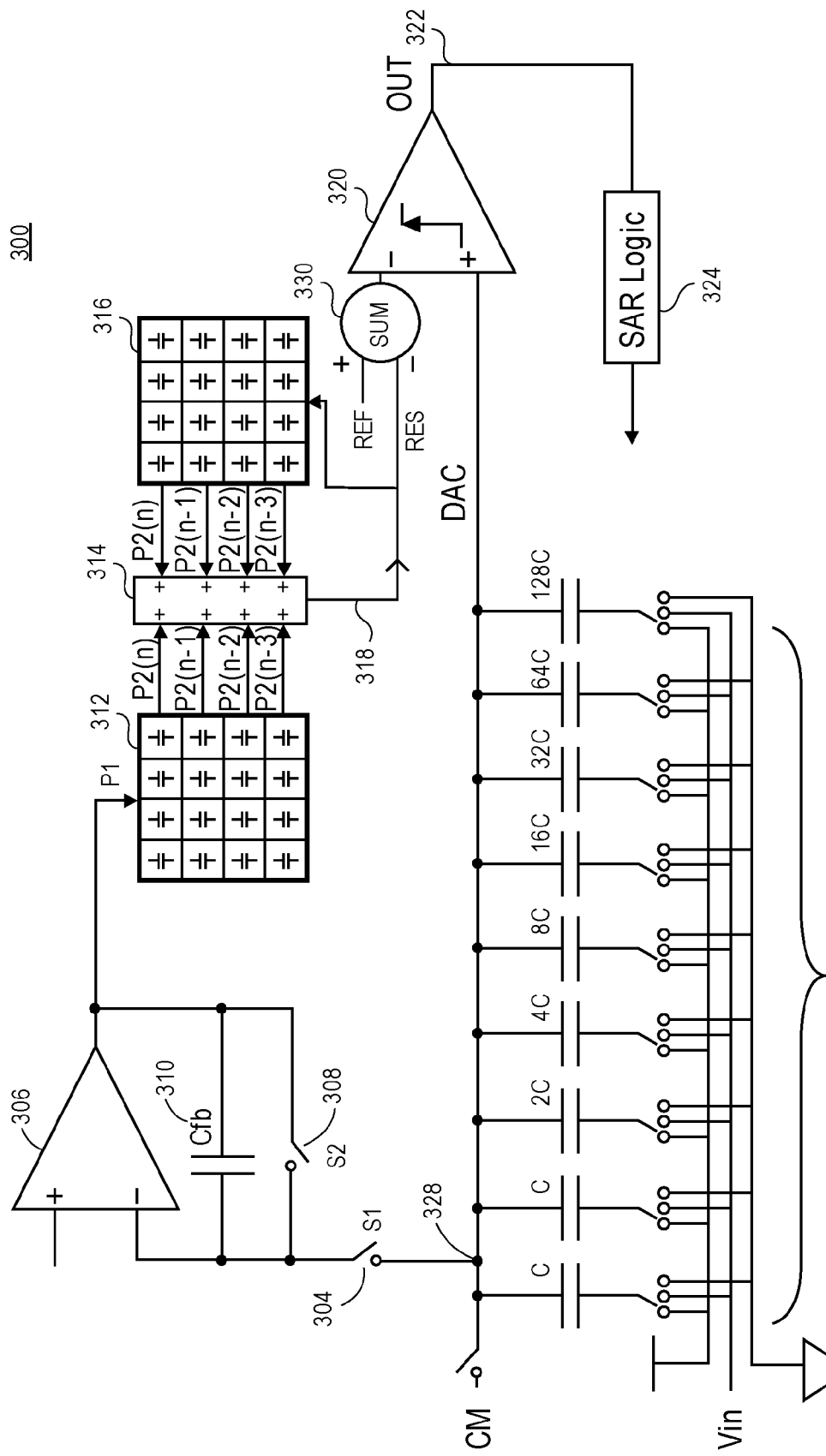
FIG. 3 is a schematic illustrating an Infinite Impulse Response (IIR) Sampled Error Feedback SAR, according to some embodiments of the disclosure.

FIG. 3 is a schematic illustrating a SAR 300, according to some implementations. The SAR 300 is an Infinite Impulse Response (IIR) Sampled Error Feedback (SEFB) SAR with direct DAC sampling. The SAR 300 includes a DAC array 302, a comparator 320, and SAR logic 324, similar to the elements shown in the SAR 200 of FIG. 2. The bottom plate of the DAC array 302 samples the signal and then proceeds through a SAR cycle. Once the SAR implements a binary search (for example, 7-8 bits), there is a residue on the DAC node 328. According to one implementation, the DAC array implements one more convert cycle with input from the SAR logic, and the representation of the quantization noise remains on the DAC output line 326.

The s1 switch 304 is then closed to transfer charge from the DAC node 328 to a preamplifier 306, and an amplified charge is input to the input array 312. The input array 312 is implemented using Sampled Analog Technology (SAT). There is loss of residue due to charge sharing. Additionally, the previous cycle's residue is stored in the output array 316. The input array 312 and output array 316 are described in greater detail with respect to FIGS. 6-10. According to various implementations, the array sizes can vary, and the size of the arrays 312, 316 depends on the desired filter transfer function, with some filter transfer functions using larger arrays than others filter transfer functions. Referring back to the filter 106 in FIGS. 1A-1B, the input is the numerator of LF and the output is the denominator of LF. The LF can be either FIR as shown in equation 1 or it can be an equivalent IIR filter, which will have a denominator.

The passive summer 314 receives inputs from the input array 312 and the output array 316. In some examples, the summer 314 uses a finite impulse response technique, as described in greater detail with respect to FIG. 9. In other examples, the summer 314 uses an infinite impulse response technique, as described in greater detail with respect to FIG. 10. The passive summer 314 receives the outputs from the input array 312 and the output array 316 and outputs a passive summer output signal, an analog residue (RES). The analog residue (RES) is placed onto the summer output line 318 and input to a second summer 330. The second summer 330 sums the RES with a reference (REF) with a polarity swap. The output from the second summer 330 is input to the comparator 320. The RES is also input to the output array 316 where it is stored until the next cycle.

The comparator 320 compares the second summer 330 output signal with the representation of the quantization noise from the DAC output line 326. The comparator 320 outputs a comparator output 322 to the SAR logic 324.

According to various implementations, the amplifier 306 alleviates charge sharing effects of the previous input array values on the input DAC residue. According to some examples, the passive sum of present residue (DAC) and previous residue (RES) represents a loss of accuracy. The loss of accuracy due to charge sharing can be mitigated by using the amplifier 306 as a gain stage. Additionally, the s2 switch 308 is placed in another line parallel to both the capacitor $C_{FB}$ 310 and the amplifier 306. When s2 switch 308 is operated, the amplifier is a voltage amplifier. When the s2 switch 308 is left open, the amplifier is an integrator. In some examples, to operate the amplifier as a voltage amplifier, the s2 switch 308 is closed during one clock cycle (p1) and open during the next clock cycle (p2).

According to some implementations, after the SAR cycles, the charge remaining on the DAC is the sampled error (e). The sampled error can be filtered with a few additional clock cycles, by the amplifier 306 dumping charge onto the input array 312, and the passive summer 314 implementing FIR or IIR filtering, and then outputting the charge back into the system for the next cycle.

Using these techniques, higher order noise transfer function can be achieved passively by modifying LF to be of a higher order. Additionally, this technique can be used to put zeros in the pass band for better signal to noise ratio in the passband. This can be achieved by properly designing LF as either FIR or IIR filters.

Figure 17:
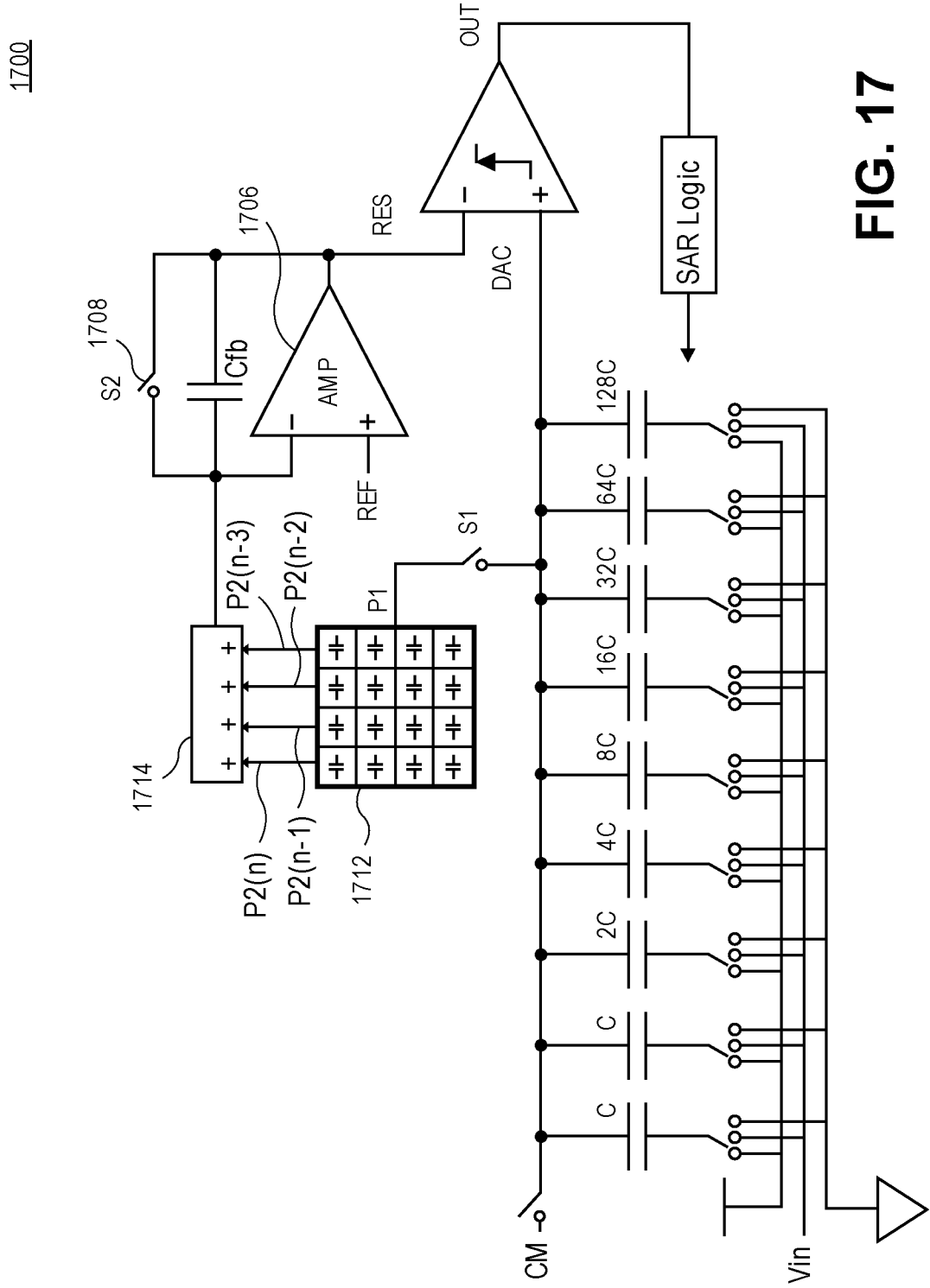
FIG. 17 is a diagram illustrating an active Finite Impulse Response Sampled Error Feedback SAR, according to some embodiments of the disclosure.

According to some implementations, gain can be added to replenish the charge in the passive charge transfer system. An amplifier, such as the amplifier 306 can add gain to the system. In other implementations, an amplifier can be positioned at the back end of the summer, as shown in FIG. 17.

As shown in FIG. 3, the output of the passive summer 314 is summed with a reference voltage at the second summer 330 before the resulting voltage is input to the comparator 320. The output of the second summer 330 is subtracted from the negative node of the comparator 320. In other implementations, the output of the second summer 330 is added to the positive side of the comparator 320 input. Adding the output of the second summer 330 to the positive side of the comparator 320 results in a much larger charge sharing loss given the size of the DAC capacitance.

Thus, there are three phases to Sampled Error Feedback: a sampling phase, a conversion phase, and a filtering phase. In the Sampling phase, the input, and the low pass filtered residue from last conversion phase, are sampled on to the DAC capacitors. In one example:

$$Vin_i = Vin + Vfiltered\_residue_{i-1}$$

where i indicates the timestamp associated with the sample. The timestamp corresponds to a clock that determines when the ADC samples the data. In various implementations, the sampling is one of top plate sampling and bottom plate sampling. In some examples, the addition of Vin and Vfiltered_residue$_{i-1}$ is achieved by adding Vfiltered_residue$_{i-1}$ to the input signal. In other implementations, the addition of Vin and Vfiltered_residue$_{i-1}$ is achieved by subtracting Vfiltered_residue$_{i-1}$ from the reference signal.

In the Conversion phase, a binary search algorithm is utilized to digitize Vin$_i$. Binary searching involves multiple iterations. The DAC is set to an N-bit digital word to divide the search space into two halves. For each bit of the digital word, the binary search determines whether the digital bit is a 1 or 0. The binary search is repeated N times to convert the analog signal into a N-bit digital word Vout$_i$, where Vout$_i$ includes N digital bits Vout$_{iN}$ through Vout$_{i1}$. In some implementations, the binary search is repeated more than N times, and redundancy or averaging is used in determining the state of at least one of the digital bits.

In the Filtering phase, the residue from the conversion phase, Vresidue$_i$, is sampled and a filtered residue is created by applying the Vresidue$_i$ to the loop filter and storing the result as Vfiltered_residue$_i$. This residue is the difference between Vin$_i$ and the associated digital word Vout$_i$. In some implementations, the Filtering phase involves multiple clock cycles. In some examples, the residue from multiple clock cycles is stored in the filter.

Figure 4:
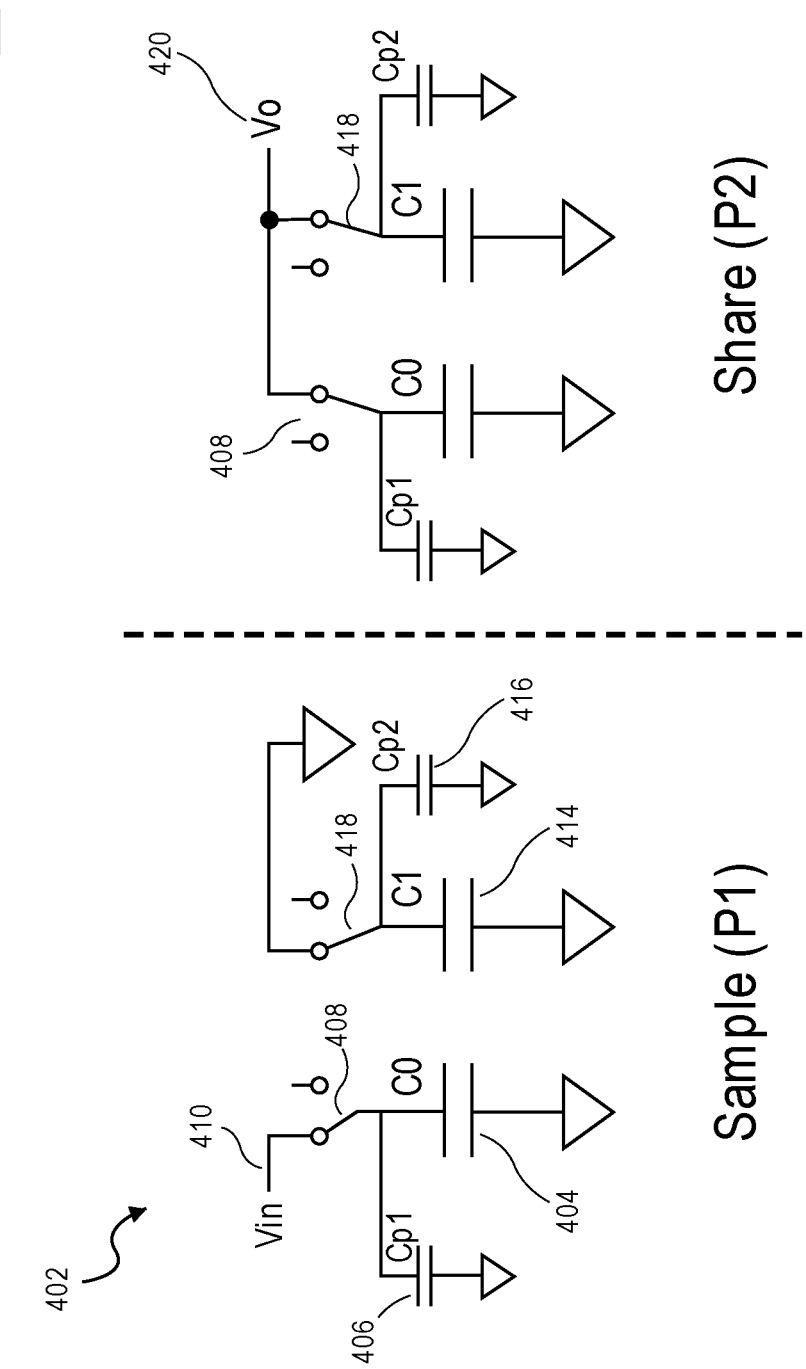
FIG. 4 is a diagram illustrating passive charge sharing, according to some embodiments of the disclosure.

FIG. 4 is a diagram 400 illustrating passive charge sharing, according to some implementations. The left side of FIG. 4 shows a circuit 402 during a sample phase. The right side of FIG. 4 shows the circuit 402 during a charge sharing phase. The circuit 402 includes a first capacitor $C_0$ 404, a second capacitor $C_1$ 414, a first parasitic capacitor $C_{p1}$ 406 and a second parasitic capacitor $C_{p2}$ 416. A bottom plate of each of the capacitors 404, 414, 406, 416 is connected to a ground. The top plate of the first capacitor $C_0$ 404 is connected to the top plate of the first parasitic capacitor $C_{p1}$ 406, and the top plates of the first capacitor $C_0$ 404 and the first parasitic capacitor $C_{p1}$ 406 are connected to a first switch 408. The top plate of the second capacitor $C_1$ 414 is connected to the top plate of the second parasitic capacitor $C_{p2}$ 416, and the top plate of the second capacitor $C_1$ 414 and the second parasitic capacitor $C_{p2}$ 416 are connected to a second switch 418.

As shown on the left side of FIG. 4, during the sample phase (P1), the first switch 408 is connected to an input voltage $V_{in}$ 410, allowing charge transfer from the input voltage $V_{in}$ 410 to the first capacitor $C_0$ 404 and the first parasitic capacitor $C_{p1}$ 406. During the sample phase, the second switch 418 is connected to a ground.

As shown on the right side of FIG. 4, during the share phase (P2), the first and second switches 408 and 418 are flipped, and the first and second capacitors 404, 414 (and first and second parasitic capacitors 406, 416) are connected in parallel, allowing charge from the first capacitor 404 and the first parasitic capacitor 406 to transfer to the second capacitor 414 and the second parasitic capacitor 416. As shown in FIG. 4, the charge on the line connecting the first and second capacitors 404, 414 is a voltage $V_0$ 420.

For the capacitors in FIG. 4:

$$(C_0+C_1+C_{P1}+C_{P2}) \cdot V_o(n) = (C_0+C_{P1})V_{in}(n) \quad (2)$$

$$\frac{V_o}{V_{in}} = \frac{C_0 + C_{P1}}{C_0 + C_1 + C_{P1} + C_{P2}} \quad (3)$$

In order to minimize voltage loss in the passive charge sharing filter of FIG. 4, $C_0 \gg C_1$ and the parasitics ($C_{P1,P2}$) are minimized.

Figure 5:
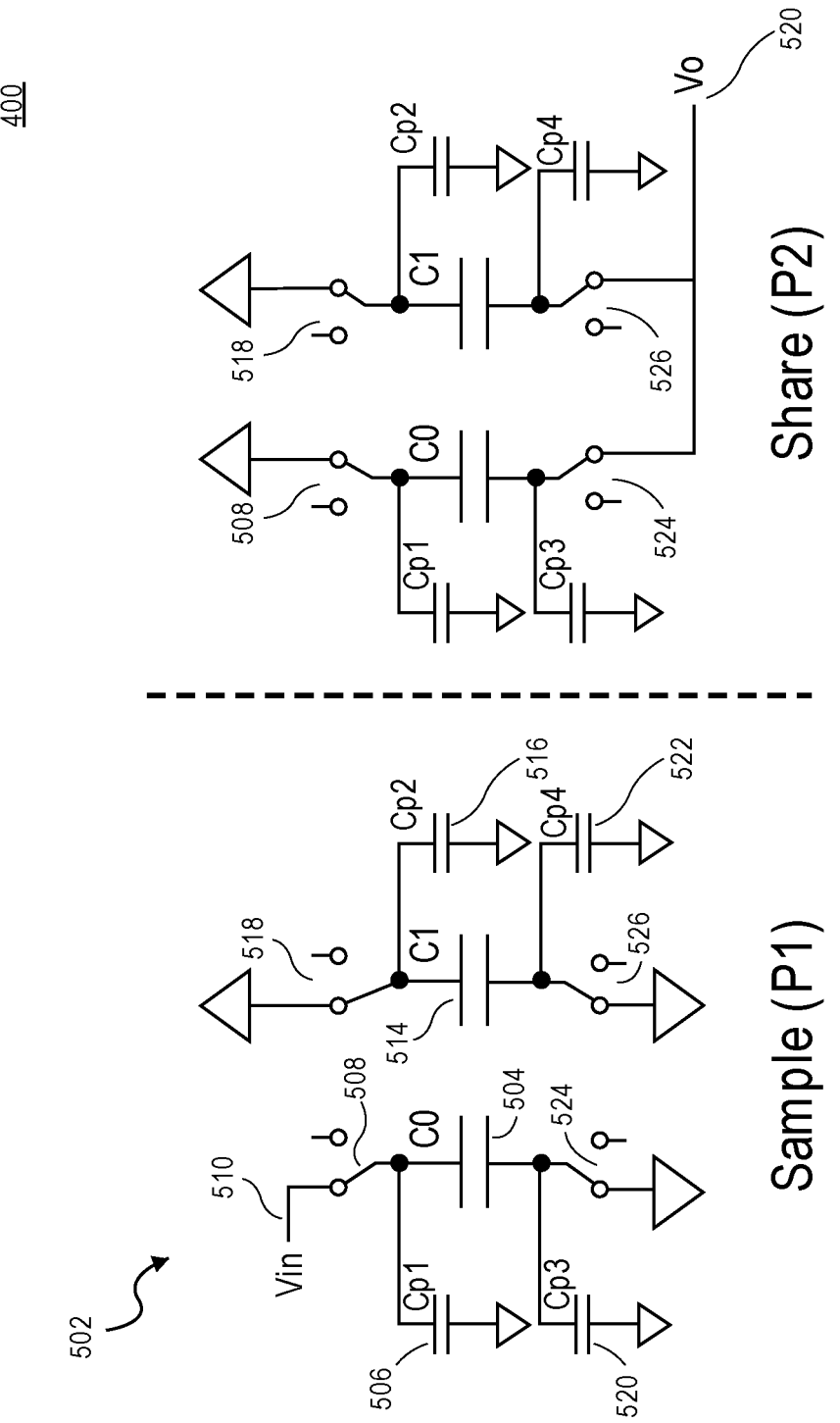
FIG. 5 is a diagram illustrating parasitic insensitive passive charge sharing, according to some embodiments of the disclosure.

FIG. 5 is a diagram illustrating parasitic insensitive passive charge sharing, according to some implementations. The left side of FIG. 5 shows a circuit 502 during a sample phase (P1). The right side of FIG. 5 shows the circuit 502 during a charge sharing phase (P2). The circuit 502 includes a first capacitor $C_0$ 504, and a second capacitor $C_1$ 514, and a first, second, third and fourth parasitic capacitor $C_{p1}$ 506, 516, 520, and 522. A bottom plate of each of the parasitic capacitors 506, 516, 520, 522 is connected to ground.

The top plate of the first capacitor $C_0$ 504 is connected to the top plate of the first parasitic capacitor $C_{p1}$ 506, and the top plates of the first capacitor $C_0$ 504 and the first parasitic capacitor $C_{p1}$ 506 are connected to a first switch 508. The bottom plate of the first capacitor $C_0$ 504 is connected to the top plate of the third parasitic capacitor $C_{p3}$ 520, and the bottom plate of the first capacitor $C_0$ 504 and the top plate of the third parasitic capacitor $C_{p3}$ 520 are connected to a third switch 524. The top plate of the second capacitor $C_1$ 514 is connected to the top plate of the second parasitic capacitor $C_{p2}$ 516, and the top plate of the second capacitor $C_1$ 514 and the second parasitic capacitor $C_{p2}$ 516 are connected to a second switch 518. The bottom plate of the second capacitor $C_1$ 514 is connected to the top plate of the fourth parasitic capacitor $C_{p4}$ 522, and the bottom plate of the second capacitor $C_1$ 514 and the top plate of the fourth parasitic capacitor $C_{p4}$ 522 are connected to a fourth switch 526.

As shown on the left side of FIG. 5, during the sample phase (P1), the first switch 508 is connected to an input voltage $V_{in}$ 510, allowing charge transfer from the input voltage $V_{in}$ 510 to the first capacitor $C_0$ 504 and the first parasitic capacitor $C_{p1}$ 506. During the sample phase, the second switch 518 is connected to a ground. Similarly, during the sample phase, the third 524 and fourth 526 switches are connected to grounds.

As shown on the right side of FIG. 5, during the share phase (P2), the first and second switches 508 and 518 are flipped, and both the first and second switches 508 and 518 are connected to grounds. The third and fourth switches 524, 526 are also flipped, and the bottom plates of first and second capacitors 504, 514 are connected, allowing charge from the first capacitor 504 and to transfer to the second capacitor 514. As shown in FIG. 5, the charge on the line connecting the first and second capacitors 504, 514 is a voltage $V_0$ 520.

For the capacitors in FIG. 5:

$$(C_0+C_1+C_{P3}+C_{P4}) \cdot V_o(n) = -C_0 V_{in}(n) \quad (4)$$

$$\frac{V_o}{V_{in}} = -\frac{C_0}{C_0 + C_1 + C_{P3} + C_{P4}} \quad (5)$$

As shown in FIG. 5, there is an inversion. $C_{P3,P4}$ are not charged to signal, while $C_{p1}$ is charged to signal and discharged to ground. According to some implementations, in order to minimize voltage loss, $C_0 \gg C_1$, and the effect of parasitic capacitors $C_{P3}, C_{P4}$ are minimized. Stray capacitances can be minimized through device and layout technology.

Figure 6:
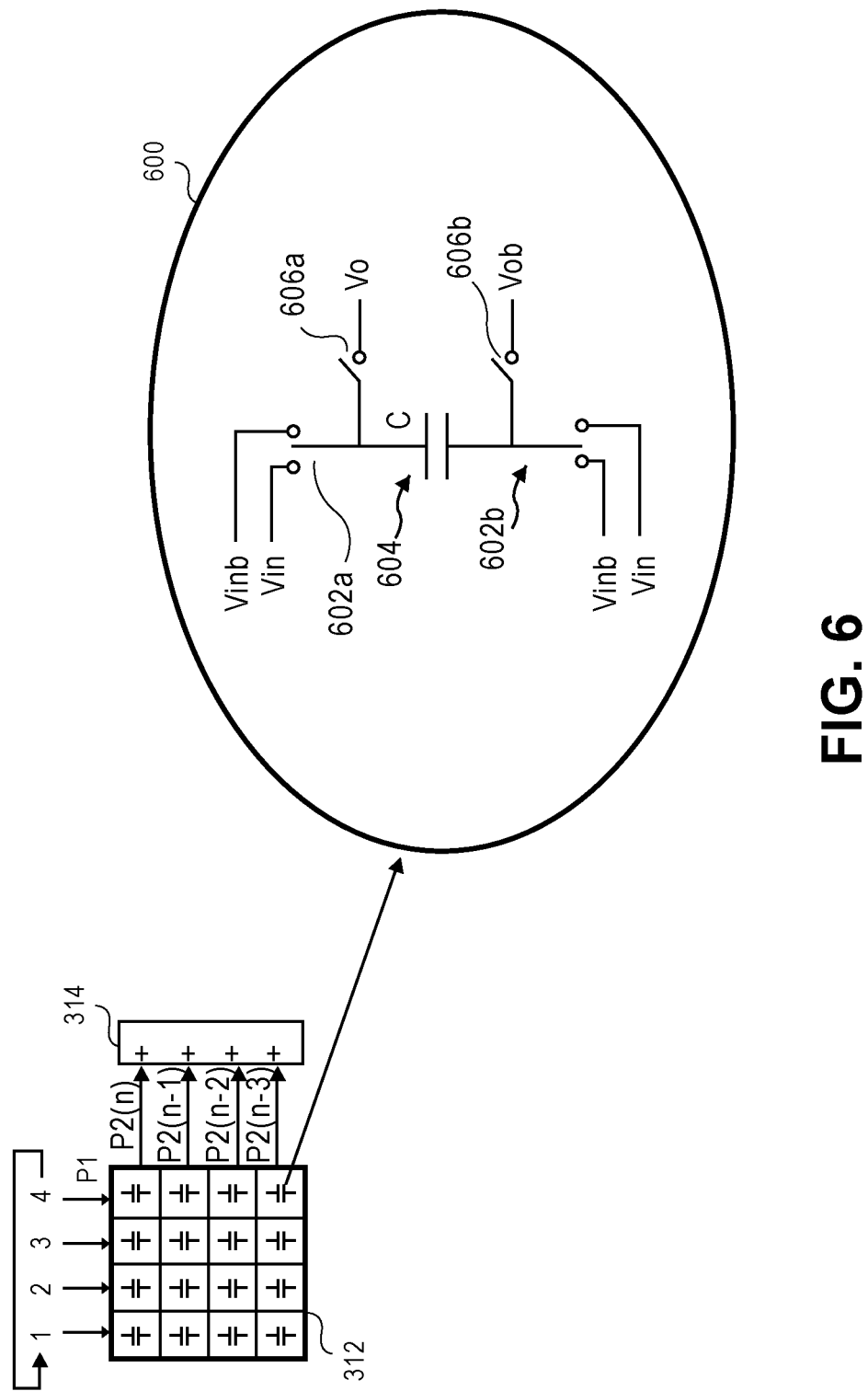
FIG. 6 is a diagram illustrating a Sampled Analog Technology (SAT) bitcell, according to some embodiments of the disclosure.

FIG. 6 is a diagram illustrating a Sampled Analog Technology (SAT) bitcell 600 of an input array, according to some implementations. In some implementations, an input array includes a matrix of SAT bitcells 600. The SAT bitcell 600 as shown in FIG. 6 includes a capacitor 604, first 602a and second 602b input switches, and first 606a and second 606b output switches. The first input switch 602a can connect the top plate of the capacitor 604 with one of two input voltages $V_{in}$ and $V_{inb}$. The first input switch 602a can also be in an open position, as shown in FIG. 6. The second input switch 602b can connect the bottom plate of the capacitor 604 with one of two input voltages $V_{in}$ and $V_{inb}$. The first output switch 606a can close to connect the top plate of the capacitor 604 with an output voltage $V_o$. The second output switch 606b can close to connect the bottom plate of the capacitor 604 with an output voltage $V_{ob}$.

During a sample phase (P1), at least one of the first 602a and second 602b input switches is closed to connect the capacitor 604 with an input voltage. During a share phase (P2), at least one of the first 606a and second 606b output switches is closed to connect the capacitor 604 with an output voltage.

In various implementations, SAT bitcells 600 are used to form capacitor arrays. In some examples, SAT bitcells 600 are used to form input arrays, and in some examples, SAT bitcells 600 are used to form output arrays.

Figure 7A:
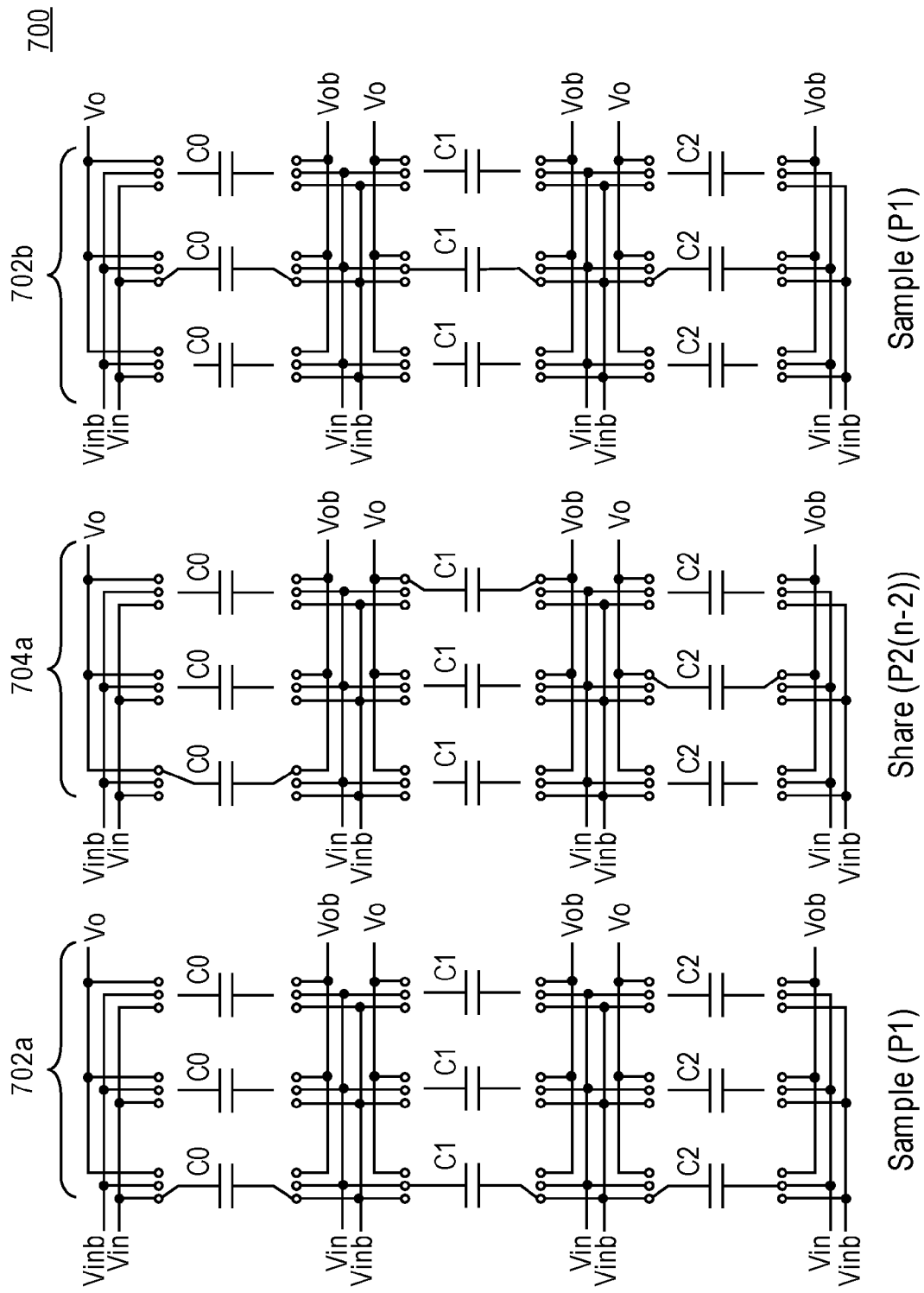
FIGS. 7A-7B show a diagram illustrating SAT switching in an example having 3 clocks, according to some embodiments of the disclosure.
Figure 7B:
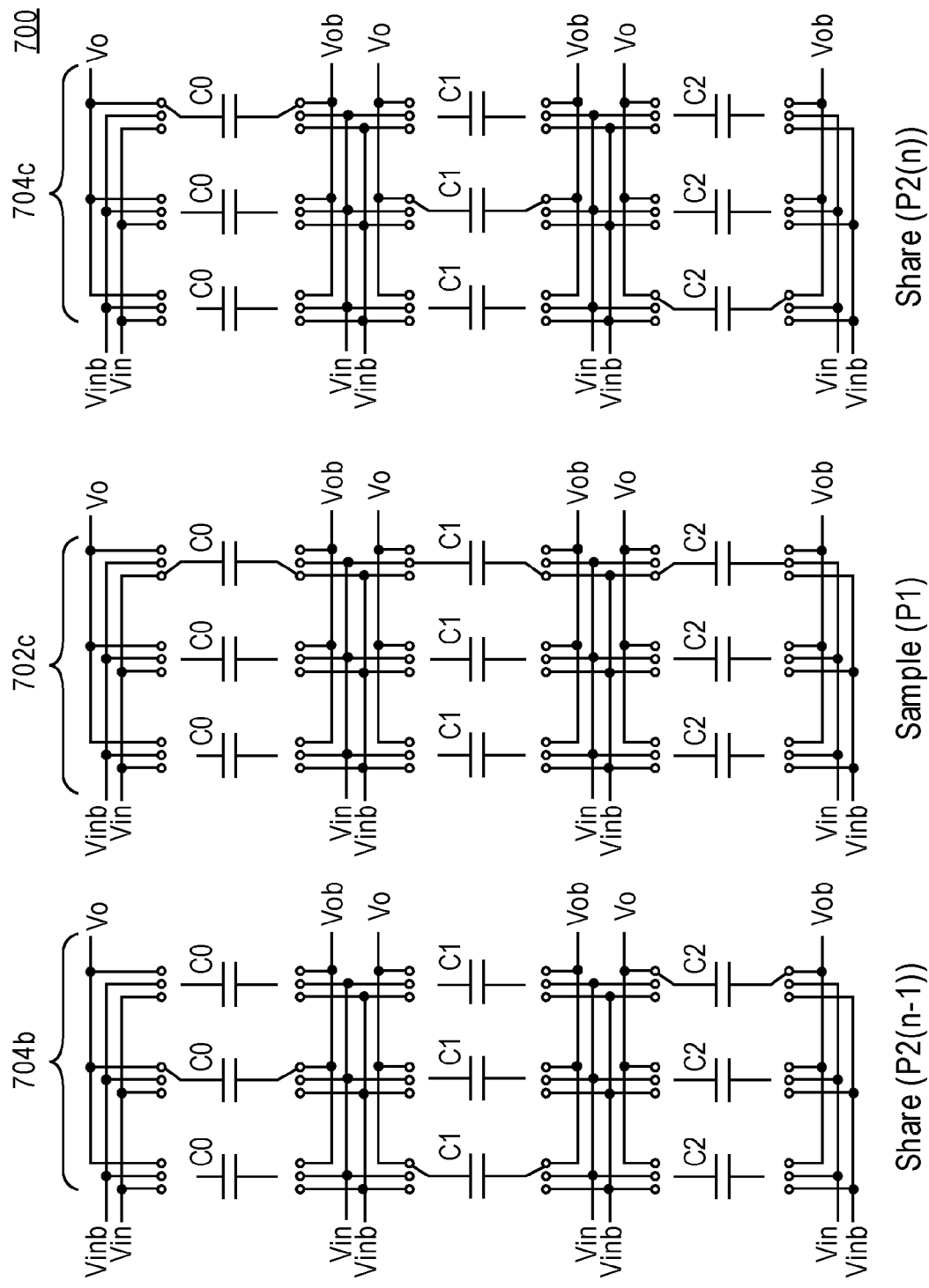

FIGS. 7A-B show a diagram 700 illustrating a 3×3 SAT bitcell array during first 702a, second 702b, and third 702c sample phases, and first 704a, second 704b, and third 704b share phases, according to some implementations. In various examples, the capacitor values $C_0$, $C_1$, and $C_2$ depend upon desired filter characteristics, and in some examples, the capacitor values $C_0$, $C_1$, and $C_2$ differ from each other. In other examples, the capacitor values $C_0$, $C_1$, and $C_2$ have the same value. The diagram 700 illustrates an example of switch configurations for three consecutive clock cycles. Each clock cycle includes a sample phase, in which an input signal is sampled, and a share phase, in which the charge stored on one or more capacitors during the sample phase is shared with one or more other capacitors.

As shown in FIGS. 7A-B, a first clock cycle includes a first sample phase 702a and a first share phase 704a. In the first sample phase 702a, switches are configured such that three of the nine capacitors in the 3×3 SAT bitcell array (the capacitors $C_0$, $C_1$, and $C_2$ in the left column as shown in FIG. 7) are connected to input voltage lines. In the first share phase 704a, switches are configured such that three of capacitors in the 3×3 SAT bitcell array (the capacitors $C_0$ in the top row, left column, $C_1$ in the middle row, right column, and $C_2$ in the bottom row center column, as shown in FIG. 7) are connected to output voltage lines. A second clock cycle includes a second sample phase 702b and a second share phase 704b. In the second sample phase 702b, switches are configured such that three of the nine capacitors in the 3×3 SAT bitcell array (the capacitors $C_0$, $C_1$, and $C_2$ in the center column as shown in FIG. 7) are connected to input voltage lines. In the second share phase 704b, switches are configured such that three of capacitors in the 3×3 SAT bitcell array (the capacitors $C_0$ in the top row, center column, $C_1$ in the middle row, left column, and $C_2$ in the middle row, right column, as shown in FIG. 7) are connected to output voltage lines. A third clock cycle includes a third sample phase 702c and a third share phase 704c. In the third sample phase 702c, switches are configured such that three of the nine capacitors in the 3×3 SAT bitcell array (capacitors $C_0$, $C_1$, and $C_2$ in the right column as shown in FIG. 7) are connected to input voltage lines. In the third share phase 704c, switches are configured such that three of capacitors in the 3×3 SAT bitcell array (capacitors $C_0$ in the top row, right column, $C_1$ in the middle row, center column, and $C_2$ in the bottom row left column, as shown in FIG. 7) are connected to output voltage lines.

Figure 8A:
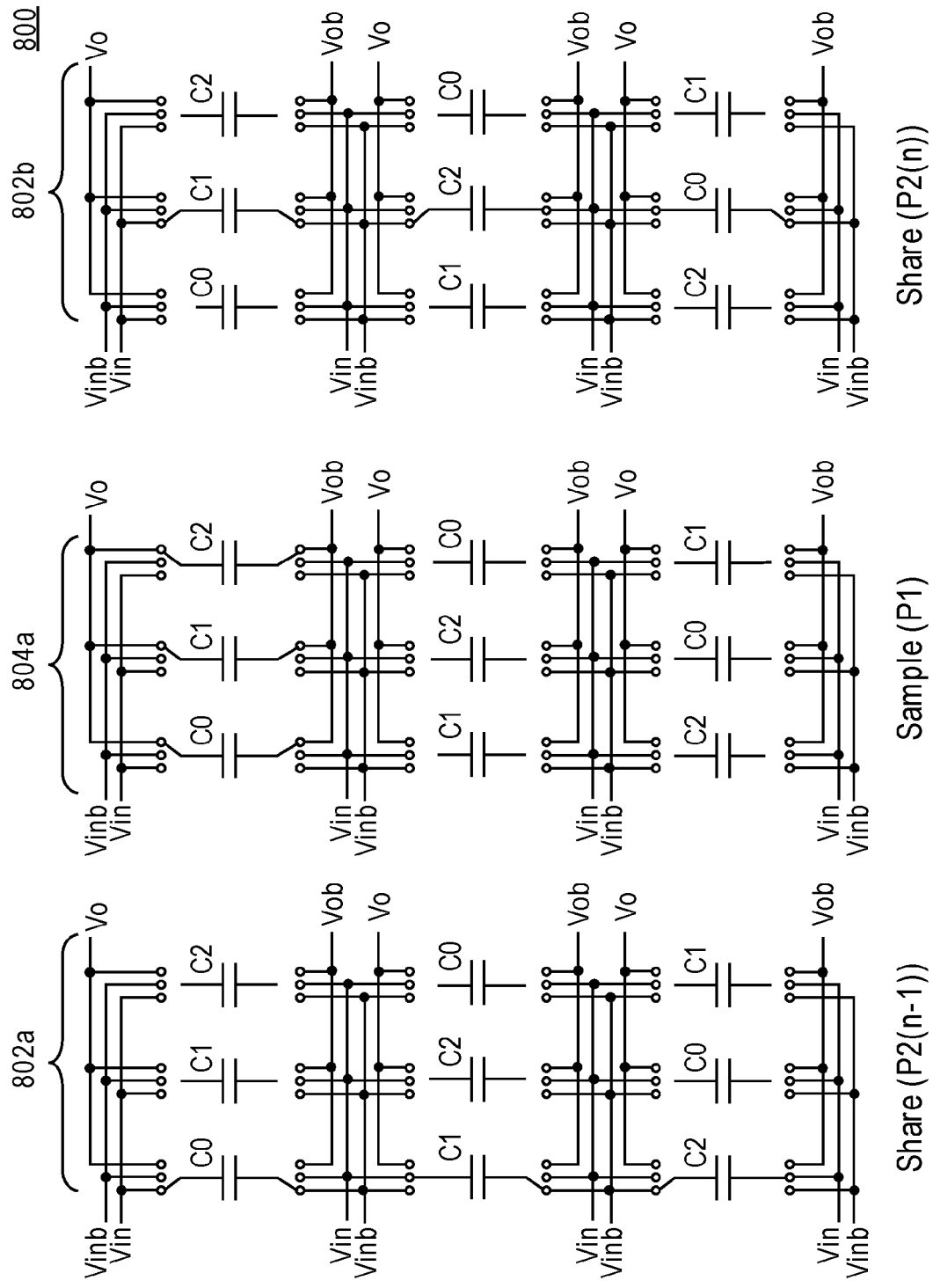
FIGS. 8A-8B show a diagram illustrating barrel shift SAT switching in an example having 3 clocks, according to some embodiments of the disclosure.
Figure 8B:
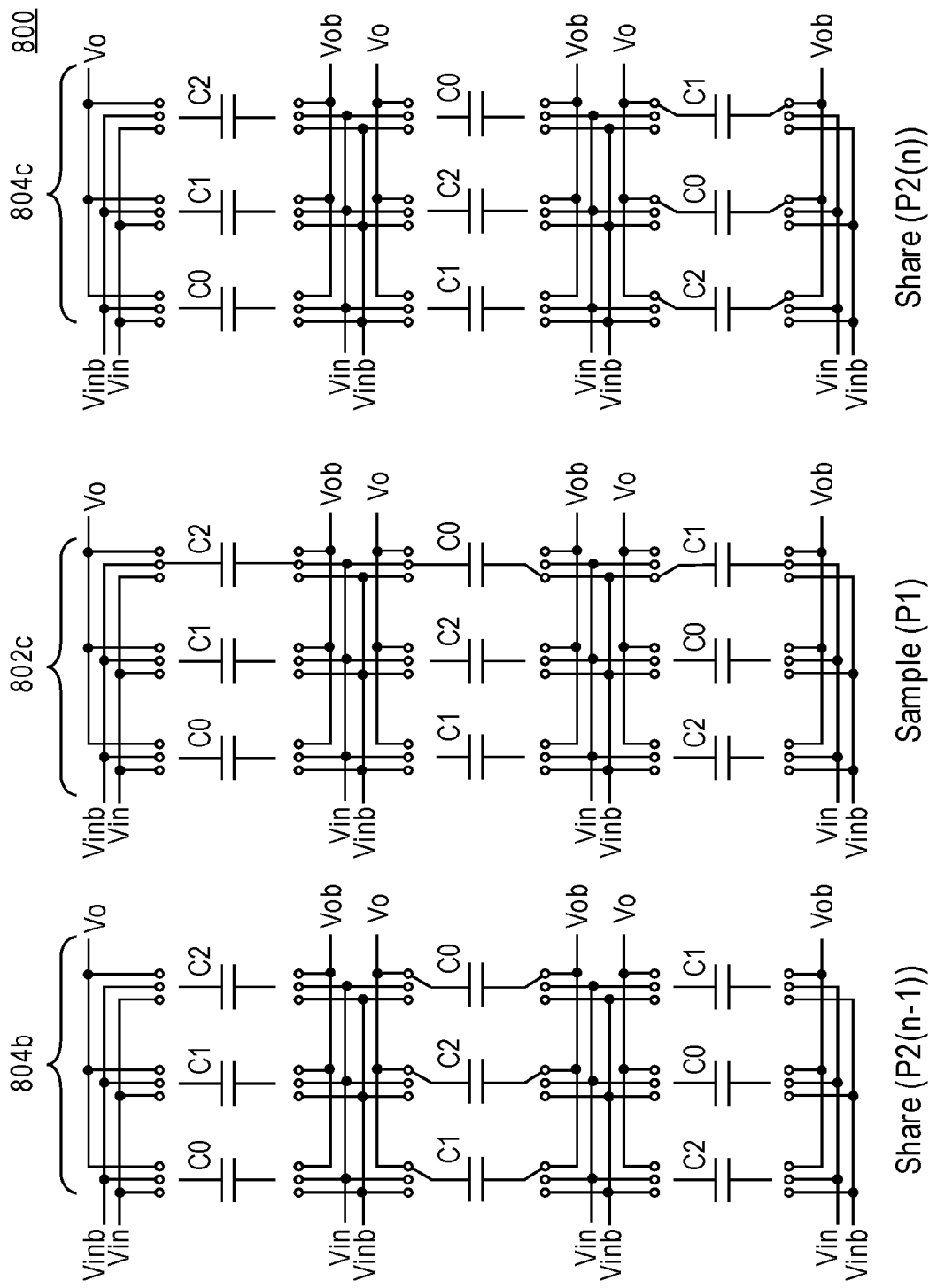

FIGS. 8A-B show a diagram 800 illustrating barrel shift SAT switching in a 3×3 SAT bitcell array during first 802a, second 802b, and third 802c sample phases, and first 804a, second 804b, and third 804b share phases, according to some implementations. The diagram 800 illustrates an example of switch configurations for three consecutive clock cycles. Each clock cycle includes a sample phase, in which an input signal is sampled, and a share phase, in which the charge stored on one or more capacitors during the sample phase is shared with one or more other capacitors.

As shown in FIGS. 8A-B, a first clock cycle includes a first sample phase 802a and a first share phase 804a. In the first sample phase 802a, switches are configured such that three of the nine capacitors in the 3×3 SAT bitcell array (the capacitors on the left-side of the 3×3 array as shown in FIG. 8) are connected to input voltage lines. In the first share phase 804a, switches are configured such that three of capacitors in the 3×3 SAT bitcell array (the capacitors on the top-side of the 3×3 array as shown in FIG. 8) are connected to output voltage lines. A second clock cycle includes a second sample phase 802b and a second share phase 804b. In the second sample phase 802b, switches are configured such that three of the nine capacitors in the 3×3 SAT bitcell array (the capacitors in the vertical center of the 3×3 array as shown in FIG. 8) are connected to input voltage lines. In the second share phase 804b, switches are configured such that three of capacitors in the 3×3 SAT bitcell array (the capacitors in the horizontal center of the 3×3 array as shown in FIG. 8) are connected to output voltage lines. A third clock cycle includes a third sample phase 802c and a third share phase 804c. In the third sample phase 802c, switches are configured such that three of the nine capacitors in the 3×3 SAT bitcell array (the capacitors on the right side of the 3×3 array as shown in FIG. 8) are connected to input voltage lines. In the third share phase 804c, switches are configured such that three of capacitors in the 3×3 SAT bitcell array (the capacitors on the bottom side of the 3×3 array as shown in FIG. 8) are connected to output voltage lines.

According to some implementations, the filters discusses herein, such as the 3×3 SAT bitcell arrays of FIGS. 7A,B and 8A,B, can be programmable filters. The filters can include a programmable filter order and programmable filter coefficients. In some implementations, a filter is programmable to program pass band zeros for different bandwidths. In some examples, a filter has a programmable bandwidth. In some implementations, the filters have a charge mode and a current mode.

Figure 9:
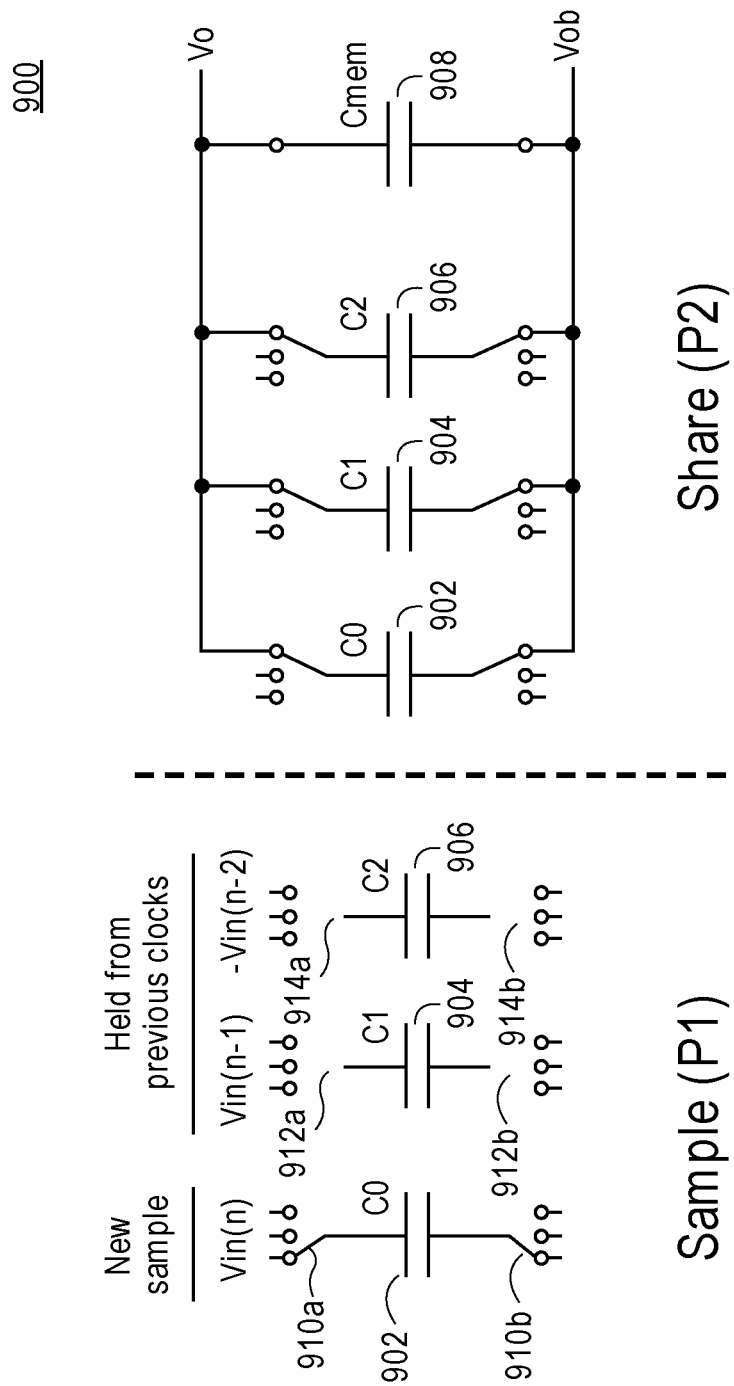
FIG. 9 is a diagram 900 illustrating passive FIR sampling, according to some implementations.

FIG. 9 is a diagram 900 illustrating passive FIR sampling, according to some implementations. The circuit shown in FIG. 9 includes first 902, second 904, and third 906, and fourth 908 capacitors, positioned in parallel. The first 902, second 904, and third 906 capacitors are connected to first 910a,b, second 912a,b, and third 914a,b sets of switches, respectively. As shown on the left-hand side of FIG. 9, during a sample phase P1, the first 910a and second 910b switches connect the top and bottom plates of the first capacitor 902 with input voltage lines $V_{in}$, and the first capacitor 902 collects a new sample. The second 904 and third 906 capacitors are not connected to input lines and hold charge from previous clock cycles. In particular, the second capacitor 904 holds a charge from the previous clock cycle (n−1), and the third capacitor 906 holds a negative charge from the clock cycle before the previous clock cycle (n−2). During a share phase, the first 910a,b, second 912a,b, and third 914a,b sets of switches connect the top plates of the first 902, second 904, and third 906 capacitors to an output line $V_o$, and the bottom plates of the first 902, second 904, and third 906 capacitors to an output line $V_{ob}$. The fourth capacitor 908 is also connected in parallel to the first 902, second 904, and third 906 capacitors to the output lines $V_o$ and $V_{ob}$.

In FIG. 9, the first includes first 902, second 904, and third 906 capacitors show capacitor values as C0, C1, and C2. The capacitor values C0, C1, and C2 are filter general signed coefficients. The capacitors can have positive or negative charges. A negative summation of charge is done with a switch arrangement that is different from the switch arrangement for a positive summation of charge According to some examples, for the circuit shown in FIG. 9:

$$(C_{MEM}+C_0+C_1+C_2) \cdot V_o = C_0 V_{in}(n) + C_1 V_{in}(n-1) - C_2 V_{in}(n-2) \quad (6)$$

$$\frac{V_o}{V_{in}} = \left(\frac{C_0}{C_{MEM}+C_0+C_1+C_2}\right)\left(1+\frac{C_1}{C_0}z^{-1}-\frac{C_2}{C_0}z^{-2}\right) \quad (7)$$

In other examples, the C2 elements of equations (6) and (7) are added (as opposed to subtracted as shown above), but the C2 coefficient has a negative value.

In some implementations, the fourth capacitor 908 is not used and is set to zero. When the fourth capacitor 908 is set to zero, $C_{MEM}$ in equations (6) and (7) equals zero. For passive FIR sampling the fourth capacitor 908 is not used, and a circuit such as the circuit shown in FIG. 9 can be implemented without the fourth capacitor 908.

In various implementations, the fourth capacitor 908 is reset to zero at each clock cycle, thereby creating an Infinite Impulse Response filter. A reset switch can be added to the fourth capacitor 908 for resetting the capacitor to zero.

Figure 10:
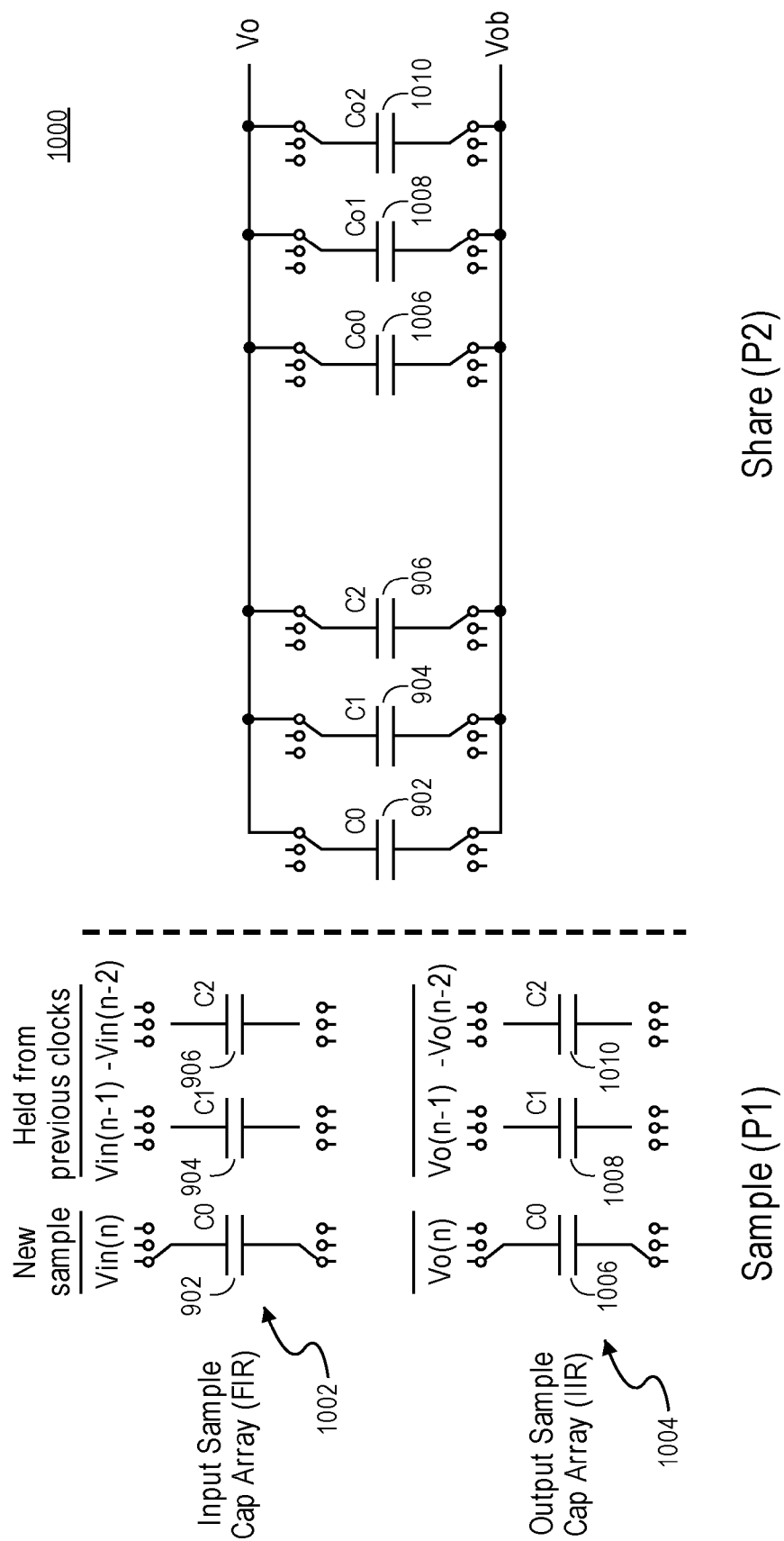
FIG. 10 is a diagram illustrating passive FIR sampling, according to some embodiments of the disclosure.

FIG. 10 is a diagram 1000 illustrating passive IIR sampling, according to some implementations. The circuit shown in FIG. 10 includes an input sample capacitor array 1002, similar to the capacitor array shown on the left side of FIG. 9, and an output sample capacitor array 1004. The input sample capacitor array 1002 functions as described with respect to the capacitor array shown on the left side of FIG. 9. The output sample capacitor array includes first 1006, second 1008 and third 1010 capacitors. During a sample phase P1, the first capacitor 1006 of the output sample capacitor array 1002 is connected to the output line $V_o$ and samples the output voltage. The second 1008 and third 1010 capacitors of the output sample capacitor array 1002 are not connected to input lines and hold charge from previous clock cycles. In particular, the second capacitor 1008 of the output sample capacitor array 1002 holds a charge from the previous clock cycle (n−1), and the third capacitor 1010 of the output sample capacitor array 1002 holds a negative charge from the clock cycle before the previous clock cycle (n−2).

During a share phase, the top plates of the first 1006, second 1008, and third 1010 capacitors of the output sample capacitor array 1002 are connected to an output line $V_o$, and the bottom plates of the first 1006, second 1008, and third 1010 capacitors of the output sample capacitor array 1002 are connected to an output line $V_{ob}$. The first 902, second 904, and third 906 capacitors are connected in parallel to the first 1006, second 1008, and third 1010 capacitors of the output sample capacitor array 1002. Thus, during the share phase, the first 902, second 904, and third 906 capacitors of the input sample capacitor array 1002, and the first 1006, second 1008, and third 1010 capacitors of the output sample capacitor array 1002, are all connected in parallel to the output lines $V_o$ and $V_{ob}$.

According to some examples, for the circuit shown in FIG. 10:

$$(C_1+C_2+C_{o0}+C_{o1}+C_{o2})V_0 = C_0V(n)+C_1V_{in}(n-1)+C_2V_{in}(n-2)+C_{o0}V_o(n-1)+C_{o1}V_O(n-2)+C_{o2}V_O(n-3) \quad (8)$$

$$C_T = C_1+C_2+C_{o0}+C_{o1}+C_{o2} \quad (9)$$

$$\frac{V_0}{V_{in}} = \left(\frac{C_0}{C_T}\right)\left(\frac{1+\frac{C_1}{C_0}z^{-1}-\frac{C_2}{C_0}z^{-2}}{1-\frac{C_{o0}}{C_T}z^{-1}+\frac{C_{o1}}{C_T}z^{-2}+\frac{C_{o2}}{C_T}z^{-3}}\right) \quad (10)$$

According to various implementations, there are several implications of passive sampling. In particular, referring to Equation (10) above and equation (12) below, one implication is that the gain is less than 1, and the gain is potentially $$\frac{C_0}{C_T} < 1.0 \quad (11)$$

$$(Matlab): TF = \frac{b_0+b_1z^{-1}+b_2z^{-2}+\ldots}{a_0+a_1z^{-1}+a_2z^{-2}+\ldots} \quad (12)$$

Another implication of passive sampling is that coefficients of the transfer function map to the ratio of individual capacitors to total capacitance. Thus, each coefficient is the ratio of a capacitor to the total capacitance. Additionally, zeroes are dependent upon individual capacitor matching. Pole locations are dependent upon denominator capacitor mismatch. In some implementations, a further implication is that for passive sampling, gain is restricted, and is equal to the ratio of total capacitance to primary feedforward term.

Figure 11:
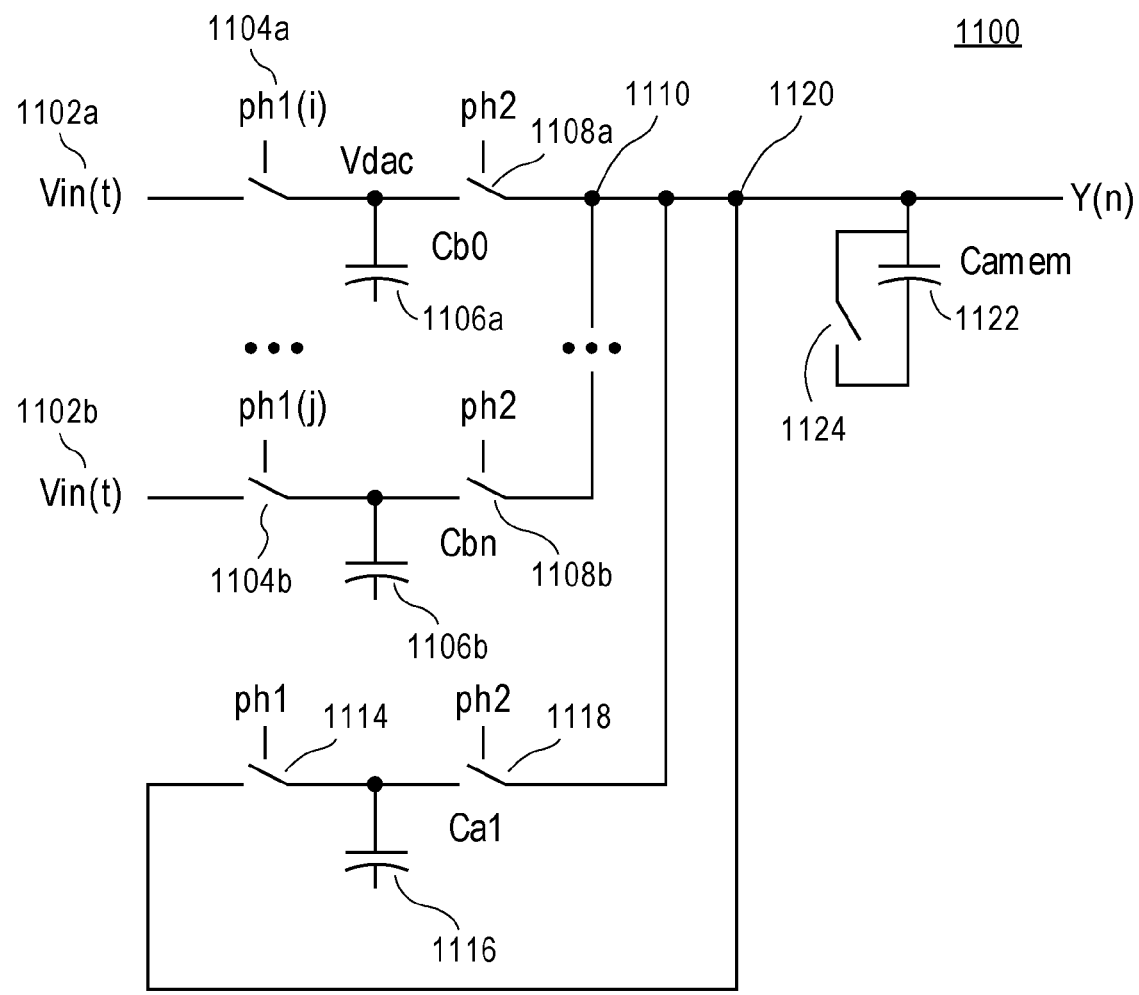
FIG. 11 is a diagram illustrating a passive IIR flow filter 1100, according to some embodiments of the disclosure.

FIG. 11 is a diagram illustrating a passive IIR flow filter 1100, according to some implementations. The filter 1100 includes an input section having multiple $V_{in}$ lines 1102a, 1102b, first capacitors 1106a, 1106b, first switches 1104a, 1104b between the input nodes and the first capacitors 1106a, 1106b, and second switches 1108a, 1108b between the capacitors and a first output node 1110. The $V_{in}$ lines 1102a, 1102b, first capacitors 1106a, 1106b, first switches 1104a, and second switches 1108a, 1108b are in parallel, and output lines from the second switches 1108a, 1108b connect at the output node 1110. During a first phase ph1, the first switches 1104a, 1104b are closed, allowing charge to flow from the $V_{in}$ lines 1102a, 1102b to the first capacitors 1106a, 1106b. During the first phase ph1, the second switches are open. During a second phase ph2, the first switches 1104a, 1104b are open, and the second switches 1108a, 1108b are closed, allowing charge to flow from the first capacitors 1106a, 1106b to the first output node 1110. In various implementations, the filter 1100 includes three or more $V_{in}$ lines 1102a, 1102b, three or more first capacitors 1106a, 1106b, three or more first switches 1104a, 1104b, and three or more second switches 1108a, 1108b.

As shown in FIG. 11, after the first output node 1110, a second capacitor 1116 and a third capacitor 1122 are connected to the output line in series. Between the first output node 1110 and the second capacitor 1116 is a third switch 1118, which is closed during the second phase p2, allowing charge to flow from the first capacitors 1106a, 1106b through first output node 1110 to the second capacitor 1116 during the second phase. The third switch 1117 is open during the first phase. After the second capacitor 1116 is a fourth switch 1114, which is open during the second phase and closed during the first phase, allowing charge to flow from the second capacitor 1116 to a second output node 1120 on the output line. Thus, during the second phase, charge is shared between the first capacitors 1106a, 1106b, the second capacitor 1116, and the third capacitor 1122, as well as being output at the end of the output line Y(n). During the first phase, charge is shared among the first capacitors 1106a, 1106b but not with the second 1116 and third 1122 capacitors. Additionally, during the first phase, charge stored on the second 1116 and third 1122 capacitors is output to the end of the output line Y(n). In some implementations, the first phase is a sample phase, and the second phase is a charge sharing phase. There is a reset switch 1124 on the third capacitor 1122 (Camem) at the output, which shorts the top of the third capacitor 1122 to the bottom of the third capacitor 1122 subject to a reset phase clock. When the reset switch 1124 is operated, the reset switch is closed during one clock cycle (p1) and open during the next clock cycle (p2). When the reset switch 1124 is closed, the third capacitor 1122 (Camem) is set to zero. According to other examples, there is an integrator at the output, and no reset switch 1124 on the third capacitor 1122.

Architecture

According to various implementations, there are many different architectural options for designing a sampled error feedback SAR, or a sigma-delta. In some examples, an explicit residue cap ($C_r$) is included to extract residue and pass it on to an input array of caps. Other examples include programmable taps. In some examples, the input capacitors can be merged with the DAC capacitors, thereby reusing the capacitors in the input array for the DAC. FIGS. 12-17 illustrate several examples of architectural variations for a sampled error feedback SAR as described herein, including Finite Impulse Response (FIR) and Infinite Impulse Response (IIR) examples.

Figure 12:
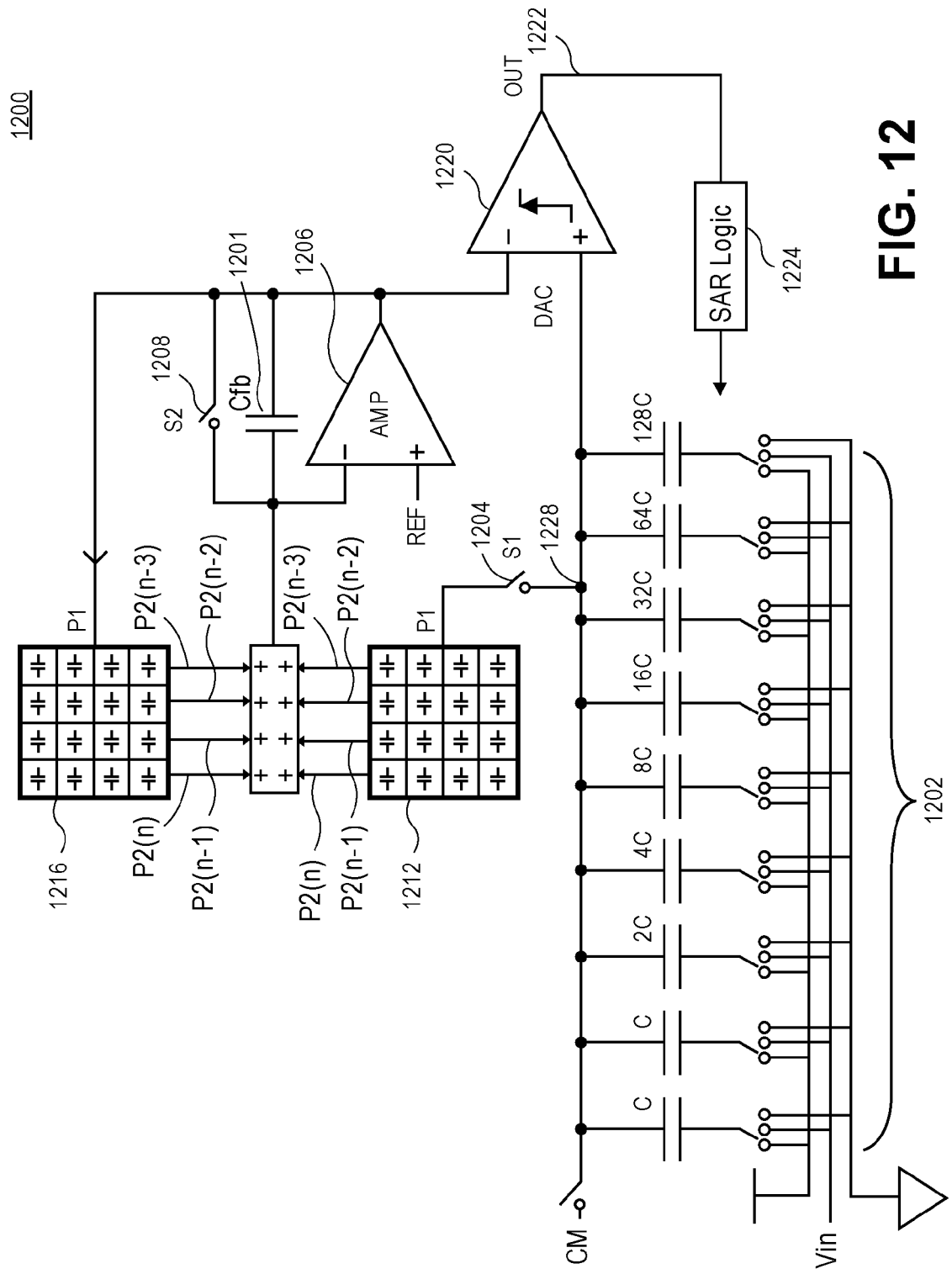
FIG. 12 is a diagram illustrating an active Infinite Impulse Response Sampled Error Feedback SAR, according to some embodiments of the disclosure.

FIG. 12 is a diagram illustrating active IIR SEFB-SAR 1200 with direct DAC sampling, according to some implementations. The architecture shown in the SAR 1200 of FIG.

12 is similar to that shown in the SAR 300 of FIG. 3. However, in the SAR 1200, an amplifier 1206 is positioned after the passive summer 1214. Thus, in the SAR 1200, the DAC residue is input to the input array 1212 from the DAC 1202 without amplification. The signals from the input array 1212 and output array 1216 are combined at the summer 1214 as described with above with respect to FIG. 3 and input array 312, output array 316 and summer 314. The output from the summer 1214 is amplified at the amplifier 1206. The amplifier 1206 alleviates charge sharing effects in the input and output arrays 1212, 1216. Direct sampling of the DAC via the input array leads to some loss of residue. According to various examples, the switch S2 1208 can be controlled to create either a true amplification function (when the switch s2 1208 is open) or an integrator (when the switch s2 1208 is closed).

Figure 13:
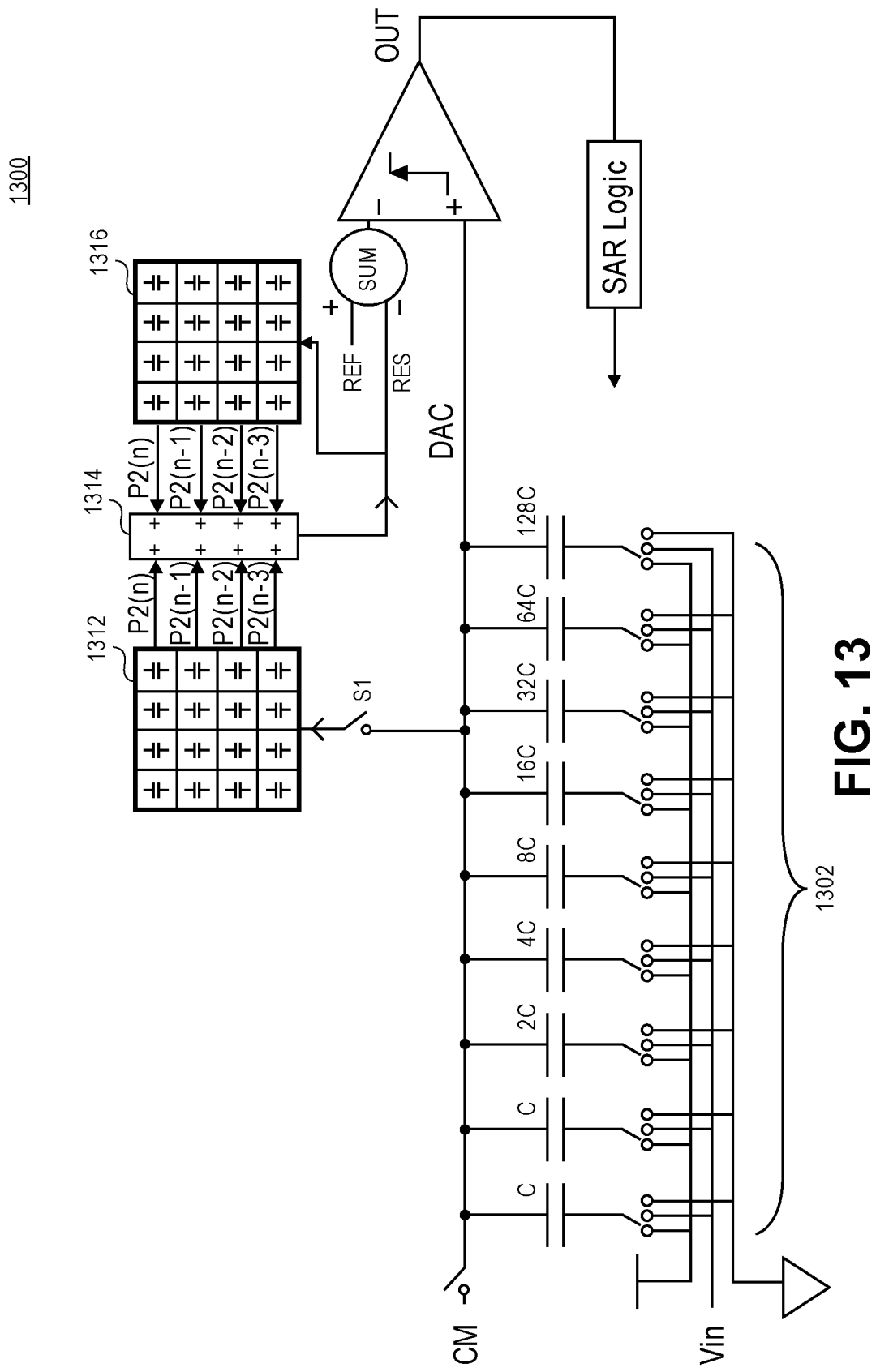
FIG. 13 is a diagram illustrating a passive Infinite Impulse Response Sampled Error Feedback SAR, according to some embodiments of the disclosure.

FIG. 13 is a diagram illustrating passive IIR SEFB-SAR 1300 with direct CAP DAC sampling, according to some implementations of the disclosure. FIG. 13 shows a SAR 1300 similar to the SAR 300 shown in FIG. 3, but without an amplifier 306. As shown in FIG. 13, at the end of the SAR conversion, the present cycle residue (DAC) is dumped into an input capacitor array 1312. The input capacitor array 1312 is implemented using SAT technology, and there is loss of residue due to charge sharing. Additionally, as described above with respect to FIG. 3, the previous cycle's residue (RES) is stored in the output array 1316. According to various implementations, the input 1312 and output 1316 array sizes can vary. In some examples, the size of the arrays depends on the desired filter transfer function, with some filter transfer functions using larger arrays than others filter transfer functions. Referring back to LF, the input is the numerator of LF and the output is the denominator of LF. The Passive Summer 1314 is substantially the same as the passive summer 314 of FIG. 3, as described above.

In some examples, the DAC 1302 capacitors are merged so they can be re-used as filter capacitors. Thus, the DAC capacitors are also used as SAR array caps. Reusing the DAC capacitors means no charge loss. In particular, reusing the DAC capacitors means duplicating some of the DAC, but no charge is wasted. According to various implementations, if the coefficients are fixed then the DAC capacitors that are duplicated have to be the correct sizes, or subdivided into the correct sizes to get FIR impulse shape of the coefficients. In some examples, this is done by using DAC least significant bit (LSB) quantization. Tap weights are quantized by LSB size, and a fixed LSB size can be used. In one example, the filter has a numerator of [0 2-1]. In other examples, if the coefficients are programmable then the input array can be an analog memory (amem) array followed by a structure like a hybrid capacitor DAC (hybridcapDAC). The amem array can comprise capacitors that are also capacitors in the DAC array. In one example, the capacitors are duplicated to make an N×N amem array. The number of DAC LSBs to be duplicated depends on the FIR order ($2^{nd}$ or $3^{rd}$, for example), and the size of the amem capacitor.

Figure 14:
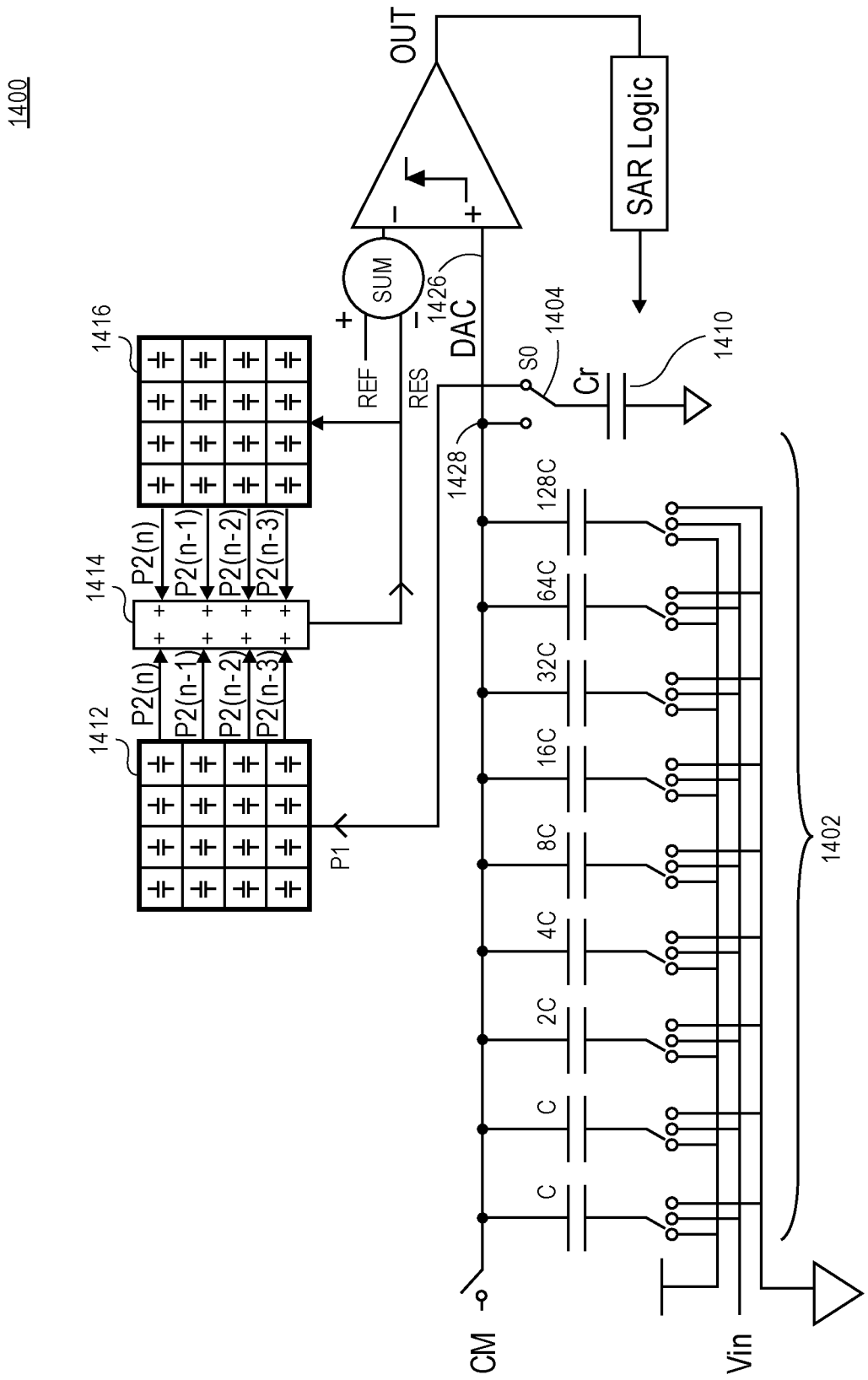
FIG. 14 is a diagram illustrating a passive Infinite Impulse Response Sampled Error Feedback SAR with residue capacitor DAC sampling, according to some embodiments of the disclosure.

FIG. 14 shows a passive IIR SEFB-SAR 1400 with residue capacitor DAC sampling, according to some implementations. The SAR 1400 is similar to the SAR 1300 shown in FIG. 13, but includes a residue capacitor 1410. The residue capacitor ($C_r$) 1410 extracts residue and passes it on to the input array 1412 of capacitors. In the SAR 1400, present cycle DAC residue is dumped onto the residue capacitor 1410 when the $s_0$ switch 1404 is connected to the DAC line 1426 at the node 1428. Then, the $s_0$ switch 1404 is connected to the input array 1412 and the residue stored on the residue capacitor 1410 is shared with the input array 1412. The SAR 1400 adds an additional charge-sharing event by adding the residue capacitor 1410. In some examples, multiple charge sharing events can result in loss of residue. In some implementations, the SAR 1400 can include an amplifier such as the amplifier 306, as well as a parallel capacitor $C_{FB}$ 310 and an s2 switch 308 as described above with respect to FIG. 3.

Figure 15:
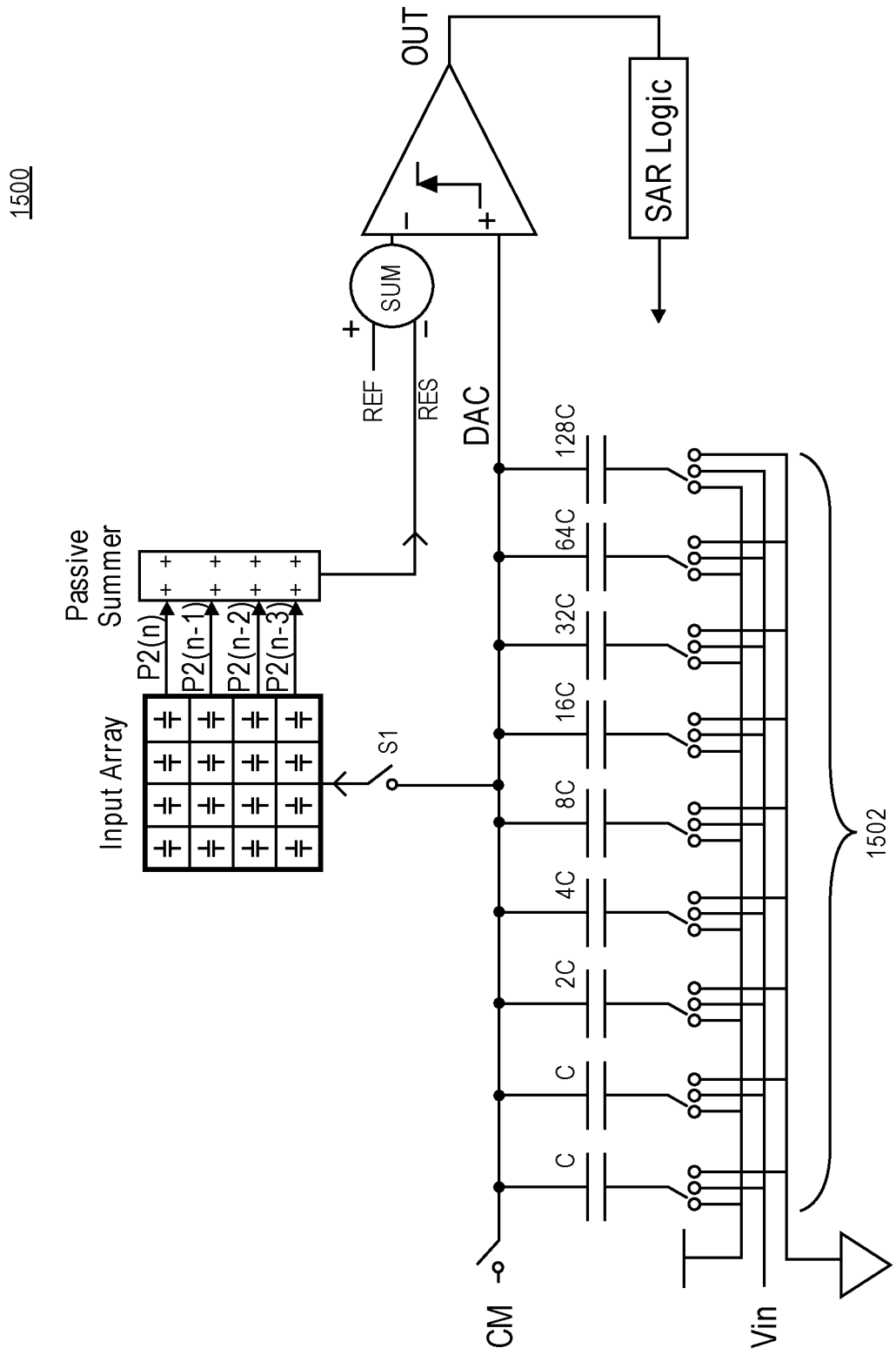
FIG. 15 is a diagram illustrating a passive Finite Impulse Response Sampled Error Feedback SAR, according to some embodiments of the disclosure.

FIG. 15 is a diagram illustrating passive FIR SEFB-SAR 1500 with direct DAC sampling, according to some implementations. As shown in FIG. 15, the FIR SAR 1500 is similar to the IIR SARs shown above, such as the SAR 300 and SAR 1300, but the FIR SAR 1500 does not include an output array of capacitors. Thus, there is no sampling of previous residue via an output array. The architecture shown in FIG. 15 implements the numerator of LF. In other implementations, a FIR SAR such as the FIR SAR 1500 can include residue capacitor DAC sampling as shown in FIG. 14 and described above.

Figure 16:
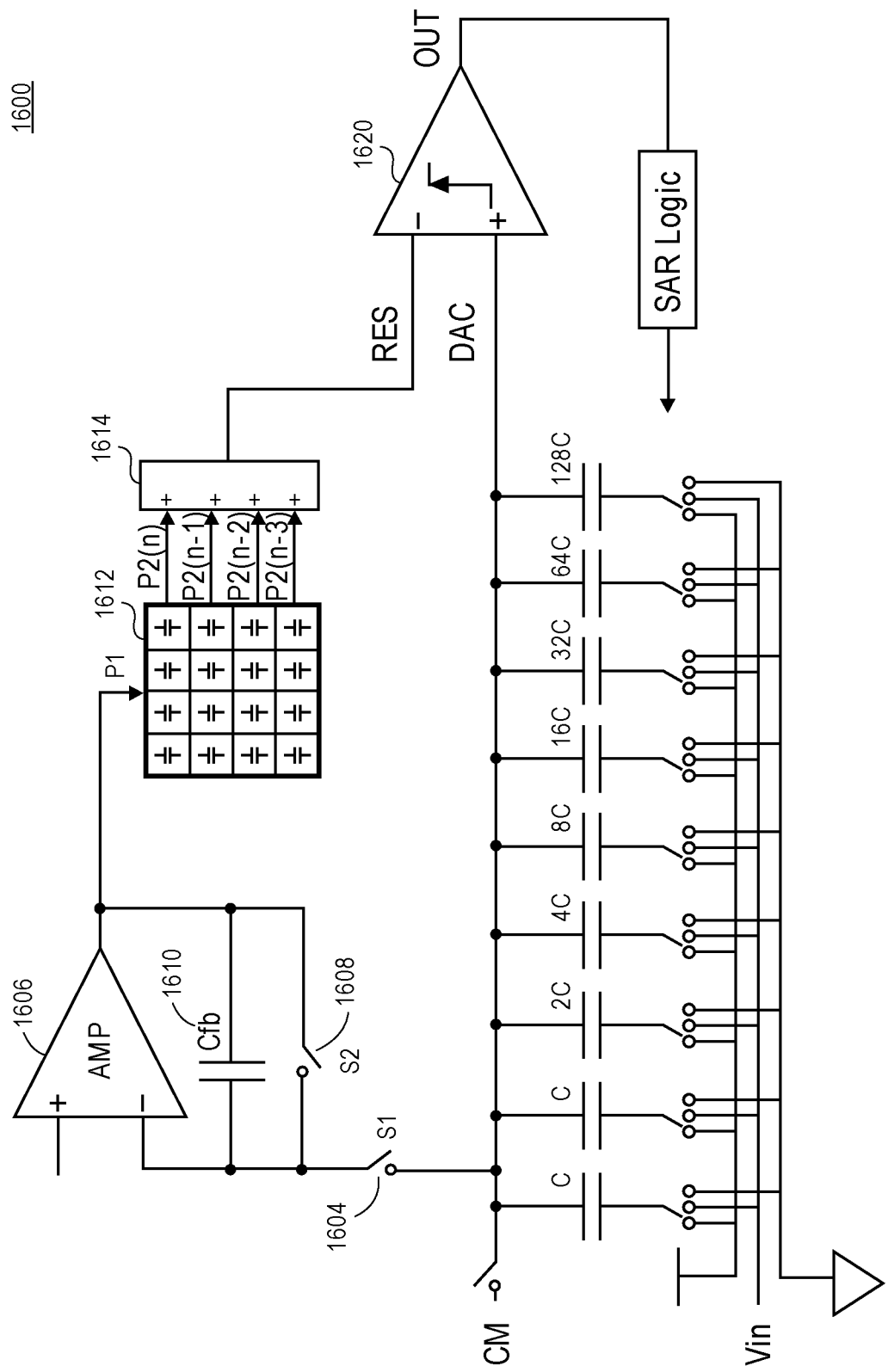
FIG. 16 is a diagram illustrating an active Finite Impulse Response Sampled Error Feedback SAR, according to some embodiments of the disclosure.

FIG. 16 is a diagram illustrating active FIR SEFB-SAR 1600 with direct DAC sampling, according to some implementations. According to some examples, the architecture in FIG. 16 implements similar functions as the architectures shown in FIG. 15. The addition of an amplifier 1606 alleviates the charge sharing effects of the input array 1612 upon residue sampling.

FIG. 17 is a diagram illustrating active FIR SEFB-SAR 1700 with direct DAC sampling, according to some implementations. The residue sampling is impacted by charge sharing of the DAC array and the input array. The addition of the amplifier 1706 after the summer 1714 alleviates the charge sharing effects of the input array 1712 when generating the RES.

Figure 18:
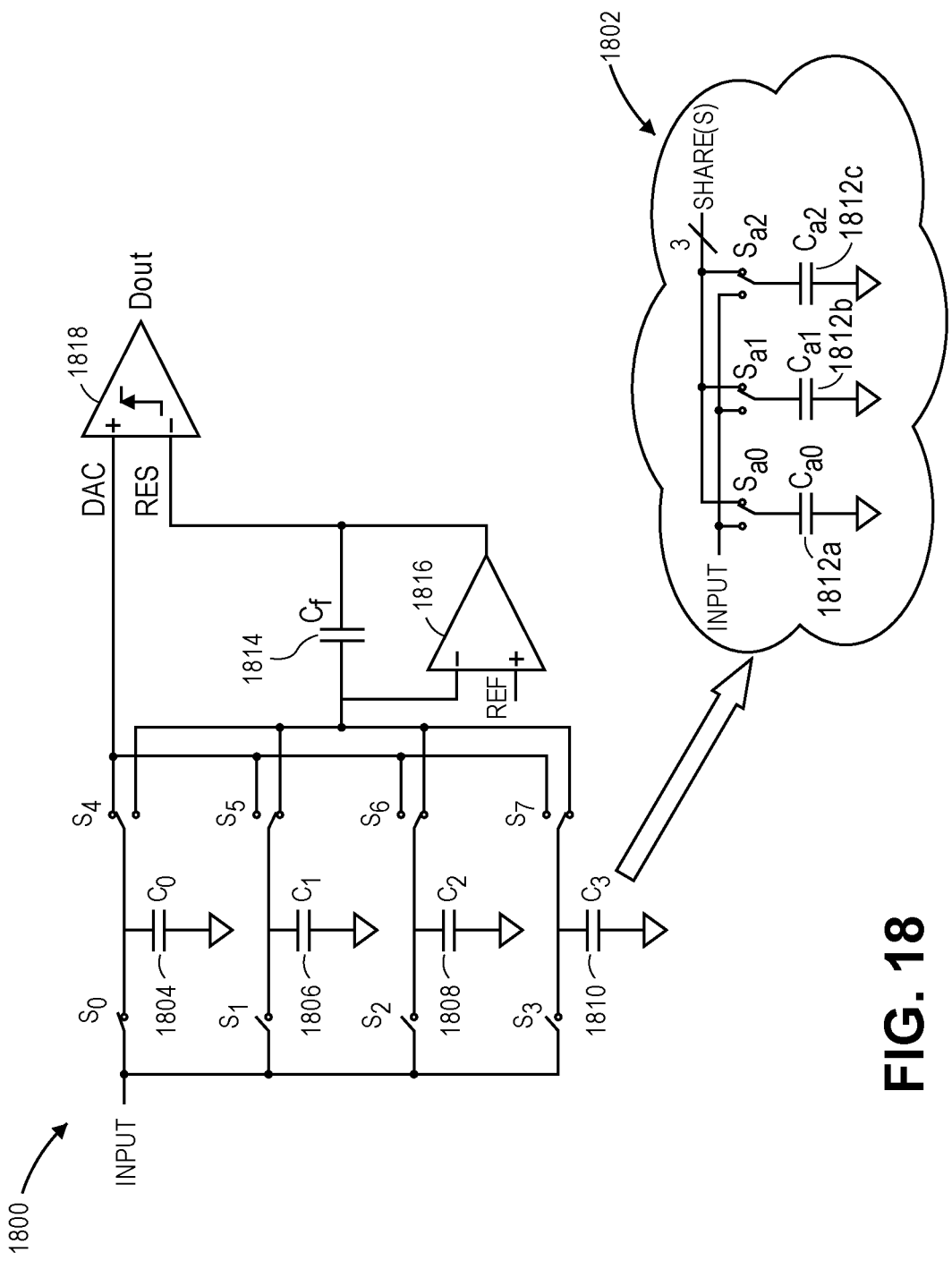
FIG. 18 is a diagram illustrating a SAR ADC with a Filter In the DAC (FIDAC), according to some embodiments of the disclosure.

In some implementations, an SAR ADC includes multiple DACs, and filtering occurs in one or more of the DACs. FIG. 18 shows a SAR ADC 1800 with a Filter In the DAC (FIDAC) 1802, according to some implementations. Filtering in a FIDAC 1802 uses data from previous conversion cycles for filtering. When a conversion is completed using one capacitor array, some of the data from that conversion is dumped into a second capacitor array. In some examples, the data dumped into the second capacitor array is dependent upon the coefficient of the second capacitor array. Thus, for first-order filtering, a conversion cycle N uses data from the previous cycle N−1. To access data from the previous conversion cycle, a second capacitor array is used. For second-order filtering, a conversion cycle N uses data from the previous cycle (cycle N−1), and the cycle before the N−1 cycle (cycle N−2). For third-order filtering, a conversion cycle N uses data from the previous (cycle N−1), data from the cycle before the N−1 cycle (cycle N−2), and data from the cycle before the N−2 cycle (cycle N−3). According to some examples, only part of a capacitor array is used in each cycle. In various implementation, N+1 DAC arrays are used to implement a filter of order N.

FIG. 18 includes first 1804, second 1806, third 1808, and fourth 1810 SAR capacitor arrays. The first 1804, second 1806, third 1808, and fourth 1810 SAR capacitor arrays are running serially, such that one of the first 1804, second 1806, third 1808, and fourth 1810 SAR capacitor arrays is used for a first SAR conversion, a next one of the capacitor arrays 1804, 1806, 1808, and 1810 is used for a second SAR conversion, and another one of the capacitor arrays 1804, 1806, 1808, and 1810 is used for a third conversion. Thus, when one of the capacitor arrays 1804, 1806, 1808, and 1810 is used for a SAR conversion, the other capacitor arrays each have data from one of the previous three conversions. When a first capacitor array 1804 is used for a SAR conversion, a proportion of a capacitor from each of the second 1806, third 1808, and fourth 1810 capacitor arrays, that is proportional to a coefficient $z^{-1}$, $z^{-2}$, $z^{-3}$) for the respective capacitor array, is dumped into a filter $C_f$. Thus, the SAR ADC 1800 performs third-order filtering.

Each of the first 1804, second 1806, third 1808, and fourth 1810 SAR capacitor arrays includes multiple capacitors. In some implementations, the SAR capacitor arrays 1804, 1806, 1808, and 1810 are binary-weighted capacitor arrays. As shown in the enlarged view 1802, the fourth SAR capacitor 1810 array includes three capacitors 1812$a$, 1812$b$, 1812$c$. In each clock cycle, data from one of the three capacitors 1812$a$, 1812$b$, and 1812$c$ is dumped to the filter $C_f$, while the other two capacitors hold charge for the next clock cycle. The capacitor 1812$a$, 1812$b$, and 1812$c$ of the capacitor array 1810 used in a clock cycle depends on the coefficient for that cycle, and the coefficients rotate with the clock cycles. Thus, in one example, in a first clock cycle, half of the capacitor array 1810 is used, and in a second clock cycle, a quarter of the capacitor array 1810 is used. The proportion of the capacitor array 1810 that is used is proportional to the coefficient.

After a capacitor array 1804, 1806, 1808, 1810 performs a SAR conversion, there is a certain charge that is on the capacitors in the capacitor array. During the next conversion, a different capacitor array performs the conversion, and some of the remaining charge on the capacitor array that performed the previous conversion is dumped into the filter. The filter includes the filter capacitor $C_f$ 1814 and an amplifier 1816.

In one example, during cycle N, a SAR conversion is performed on the first capacitor array $C_0$ 1804. During cycle N−3, a SAR conversion was performed on the second capacitor array $C_1$ 1806, during cycle N−2, a SAR conversion was performed on the third capacitor array $C_2$ 1808, during cycle N−1, a SAR conversion was performed on the fourth capacitor array $C_3$ 1810. During each clock cycle, a different part of the charge from each capacitor array is dumped into the filter capacitor $C_f$ 1814. In particular, for each capacitor array, a charge from one of the capacitors ($a_0$, $a_1$, or $a_2$) is transferred to filter capacitor $C_f$ 1814. The charge from the N−3 cycle, $a_2$ is multiplied by the coefficient $z^{-3}$, the charge from the N−2 cycle, $a_1$ is multiplied by the coefficient $z^{-2}$, and the charge from the N−1 cycle, $a_0$ is multiplied by the coefficient $z^{-1}$. Thus, the residue transferred to the filter is represented by H(z) as shown in equation 14:

$$H(z) = a_0 z^{-1} + a_1 z^{-2} + a_2 z^{-3} \quad (14)$$

Equation 14 can also be written as:

$$H(z) = \frac{C_{a0}}{C_f} z^{-1} + \frac{C_{a1}}{C_f} z^{-2} + \frac{C_{a2}}{C_f} z^{-3} \quad (15)$$

Thus, the quantization for the filtering occurs in the DAC capacitor arrays. In some implementations, sub-multiples of unit capacitors can be used to make the coefficients. A SAR capacitor array typically consists of a binary number of unit capacitors. Thus, to make a coefficient of a filter transfer function, multiples of the unit capacitors are used. In some implementations, a SAR capacitor array has a non-binary DAC. In various examples, a SAR capacitor DAC can have any type of bit weighing.

According to some implementations, the filtering in the DAC, as shown in the SAR ADC 1800 of FIG. 18, improves the signal-to-noise ratio, since the signal charge is directly used without an intervening charge transfer outside of the filter charge summation. Transferring the residue charge to a separate filter can result in some attenuation of the voltage, and adding gain to restore the voltage can add noise.

Figure 19:
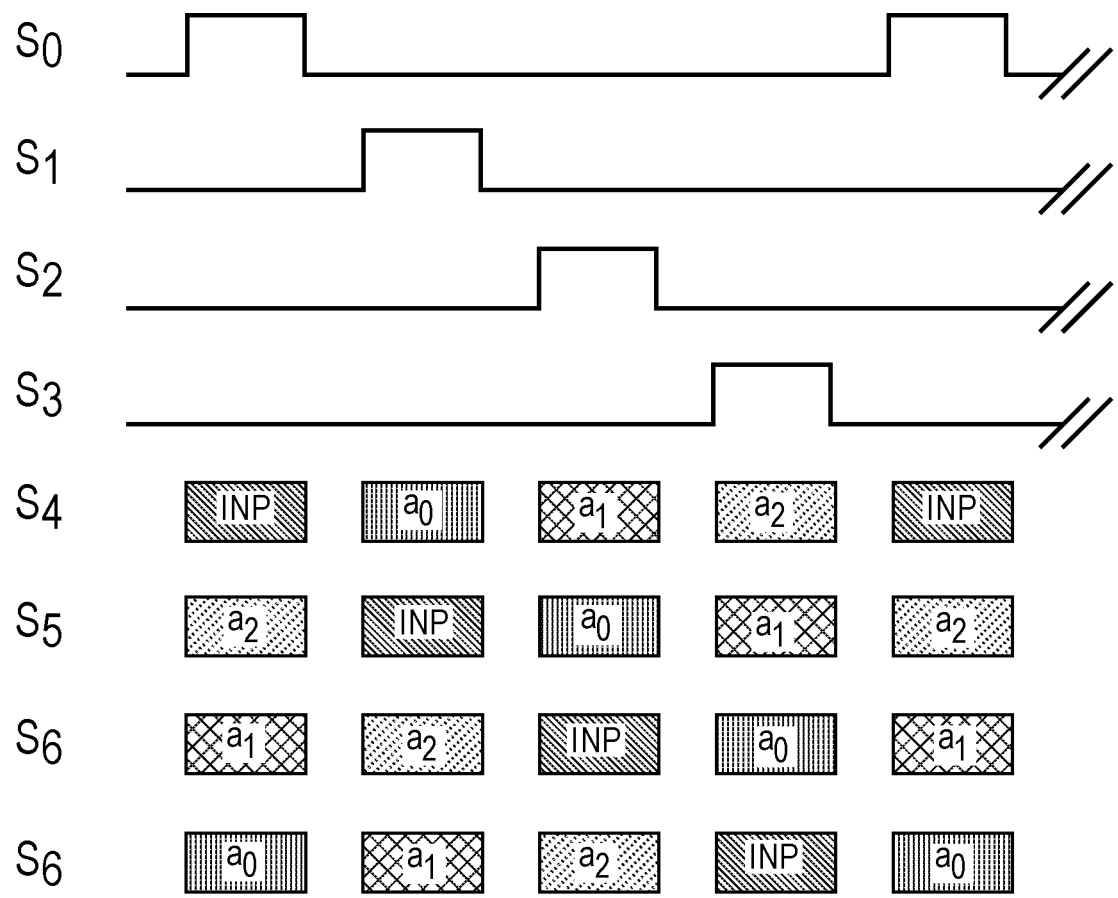
FIG. 19 is a timing diagram illustrating the sequence of operation in a Filter in DAC.

FIG. 19 is a diagram illustrating a switching chart for the switches in the SAR ADC 1800 of FIG. 18. During a first cycle, the switch $S_0$ is closed and the input $V_{in}$ is put on the first capacitor array $C_0$ 1804 which performs the SAR ADC conversion, and switch $S_4$ is closed to output the converted DAC signal. Switches $S_5$, $S_6$, and $S_7$ are connected to the filter capacitor $C_f$ 1814 and the amplifier 1816. From the switch $S_5$, the $a_2$ portion of the second capacitor array 1806 is connected to the filter, from the switch $S_6$, the $a_1$ portion of the third capacitor array 1808 is connected to the filter, and from the switch $S_7$, the $a_0$ portion of the fourth capacitor array 1810 is connected to the filter. The transferred charge is described with respect to equations 14 and 15 above. Similarly, during a second cycle, the switch $S_1$ is closed and the input $V_{in}$ is put on the second capacitor array $C_1$ 1806 which performs the SAR ADC conversion, and switch $S_5$ is closed to output the converted DAC signal. Switches $S_4$, $S_6$, and $S_7$ are connected to the filter capacitor $C_f$ 1814 and the amplifier 1816. From the switch $S_4$, the $a_0$ portion of the first capacitor array 1804 is connected to the filter, from the switch $S_6$, the $a_2$ portion of the third capacitor array 1808 is connected to the filter, and from the switch $S_7$, the $a_1$ portion of the fourth capacitor array 1810 is connected to the filter.

Referring back to FIG. 18, the converted DAC signal is input to the comparator 1818, where it is compared with a reference. According to various examples, the comparator 1818 determines whether the DAC signal is greater than or lower than the reference. The reference varies based on the filter capacitor 1814 and amplifier 1816 output. In particular, the reference is a nominal value plus or minus an error that accumulates as a result of the filter function described above.

Figure 20:
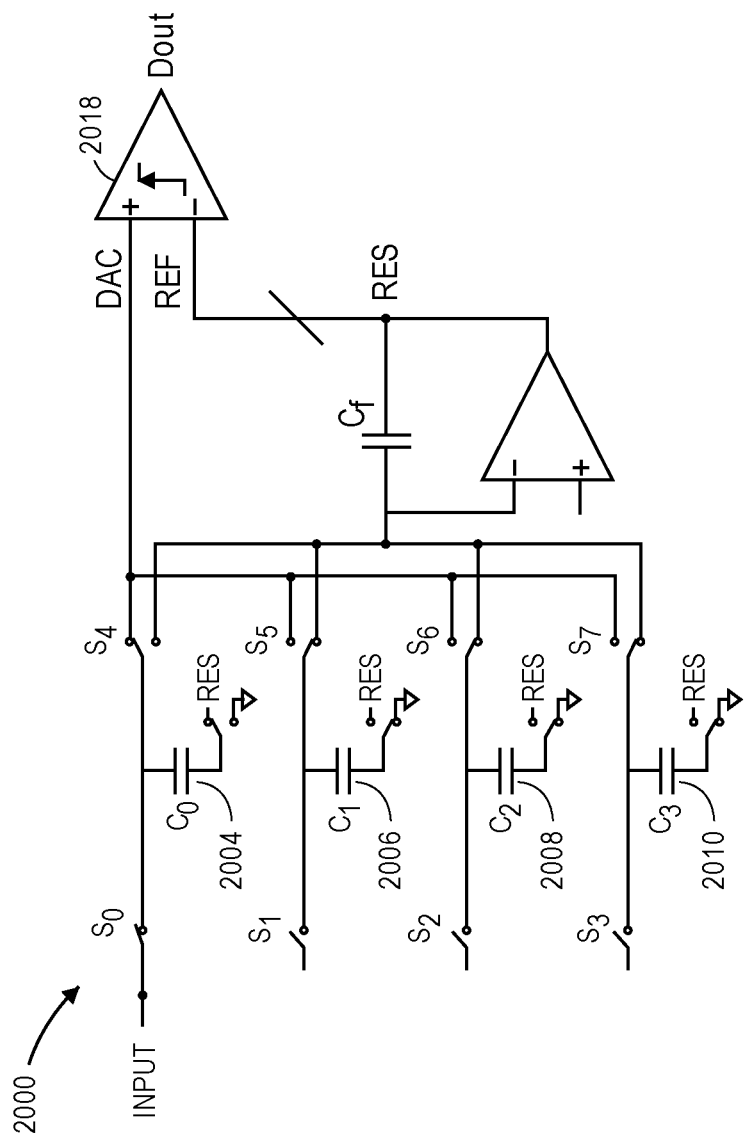
FIG. 20 is a diagram illustrating a SAR ADC with a Filter In the DAC (FIDAC) 2002, according to some embodiments of the disclosure.

FIG. 20 is a diagram illustrating an alternative SAR ADC 2000 with a Filter In the DAC (FIDAC) 2002, according to some implementations. As shown in FIG. 20, the SAR ADC 2000 compares the converted DAC output to a fixed reference at the comparator 2018. The residue from the other capacitor arrays is fed back into the capacitance sampled from the input. In particular, the residue is fed back to the bottom plate of the capacitor arrays. Thus, for example, when a top plate of a capacitor array is sampling the input, the bottom plate is charged to the residue. In one example, when the first capacitor array 2004 is sampling an input, the second 2006, third 2008, and fourth 2010 capacitor arrays are connected to the filter capacitor to generate a residue. The residue is input to the bottom plate of the first capacitor array 2004. According to some implementations, adding the residue to the sampling capacitor array increases the load on the amplifier.

Sigma Delta Modulation

The systems and methods discussed herein can also be used in oversampling converters, and in some implementations, the systems and methods discussed herein are used in sigma-delta modulation (also known as delta-sigma modulation). A sigma-delta ADC includes an oversampling modulator and a decimation filter. The sigma-delta modulator converts an incoming analog signal to a digital signal and implements a noise-shaping function to reduce noise. Thus, the filtering systems and methods described herein can be used for noise shaping in sigma-delta modulation. In some examples, a sigma-delta modulator reduces low-frequency noise.

Variations and Implementations

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the clocking and filtering functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that use sampled analog, some of which may be associated with processing real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to clocking in sampled analog systems, illustrate only some of the possible clocking functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A system for a noise-shaping successive approximation register analog-to-digital-converter comprising:
    a successive approximation register (SAR) for receiving an analog input signal and outputting a digital decision;
    a digital-to-analog converter (DAC) and logic circuitry for converting the digital decision of the SAR to a present analog residue for a present conversion cycle; and
    a filter for processing a previous analog residue from a previous conversion cycle, and for feeding a processed previous analog residue back to the SAR, wherein the filter includes a capacitor array having a first plurality of capacitors for filtering the previous analog residue to generate the processed previous analog residue; and
    a summer for summing the processed previous analog residue from the filter and the present analog residue, and generating a summer output.

2. The system of claim 1, further comprising a first switch for connecting the capacitor array to the DAC during a sample phase.

3. The system of claim 1, wherein the filter further comprises an amplifier for amplifying one of the present analog residue and the processed previous analog residue.

4. The system of claim 1, wherein the filter is one of a finite impulse response filter and an infinite impulse response filter.

5. The system of claim 1, wherein the filter is a programmable filter and includes a programmable filter order and programmable filter coefficients.

6. A method for noise-shaping in a successive approximation register analog-to-digital converter comprises:
    receiving an input analog signal at a successive approximation register (SAR),
    converting the input analog signal to a digital signal at the SAR,
    switching a DAC to convert the digital signal to a present analog residue for a present conversion cycle,
    processing a previous analog residue from a previous conversion cycle at a filter to generate a processed previous analog residue,
    outputting the processed previous analog residue to the SAR, and
    summing the processed previous analog residue and the present analog residue and generating a summer output.

7. The method of claim 6, wherein processing the previous analog residue includes:
    receiving the previous analog residue at a first capacitor array having a first plurality of capacitors, and
    summing charges from the first plurality of capacitors to generate the processed previous analog residue.

8. The method of claim 7, further comprising
    storing the summer output in a second capacitor array having a second plurality of capacitors, and wherein summing includes summing stored charges from the second plurality of capacitors.

9. The method of claim 6, further comprising amplifying one of the present analog residue and the processed previous analog residue.

10. A system for a successive approximation register analog-to-digital- converter having a noise transfer function comprising:
a successive approximation register (SAR) for receiving an analog input signal and outputting a digital decision;
a first digital-to-analog converter (DAC) and logic circuitry for converting the digital decision of the SAR to a present analog residue for a present conversion cycle;
a second DAC for processing a previous analog residue from a previous conversion cycle, and storing a processed previous analog residue at the end of the previous conversion cycle; and
a filter for receiving the processed previous analog residue from the second DAC and generating a filter output.

11. The system of claim 10, further comprising a third DAC for processing a third analog residue from a conversion cycle before the previous conversion cycle, and storing a third processed analog residue, wherein the filter is further configured to receive the third processed analog residue from the third DAC.

12. The system of claim 10, wherein the filter comprises a filter capacitor and an amplifier for amplifying the processed previous analog residue.

13. The system of claim 10, wherein the filter is configured to a high pass noise transfer function filter.

14. The system of claim 10, wherein the filter is one of a finite impulse response filter and an infinite impulse response filter.

15. The system of claim 10, wherein the filter is a programmable filter and includes a programmable filter order and programmable filter coefficients.

16. The system of claim 1, further comprising
a comparator for comparing the summer output and a first reference signal and generating a comparator output.

17. The system of claim 16, wherein the filter further comprises an output array having a second plurality of capacitors for receiving the summer output.

18. The system of claim 17, wherein the summer further sums charges from the second plurality of capacitors in generating a next summer output.

19. The method of claim 6, further comprising
comparing the summer output and a first reference signal and generating a comparator output.

20. The system of claim 10, further comprising a comparator for comparing the filter output and the present analog residue, and generating a comparator output.

21. A method for noise-shaping in a successive approximation register analog-to-digital-converter comprising:
receiving an analog input signal at a successive approximation register (SAR);
converting the analog input signal to a digital signal at the SAR;
switching a first digital-to-analog converter (DAC) to convert the digital signal of the SAR to a present analog residue for a present conversion cycle;
processing a previous analog residue from a previous conversion cycle at a second DAC,
storing a processed previous analog residue at the end of the previous conversion cycle, and
receiving, at a filter, the processed previous analog residue from the second DAC, and
generating a filter output.

* * * * *